United States Patent
Kim et al.

(10) Patent No.: US 10,804,907 B2
(45) Date of Patent: Oct. 13, 2020

(54) NON-LINEAR SPREAD SPECTRUM PROFILE GENERATOR USING LINEAR COMBINATION

(71) Applicant: Samsung Electronics Co., Ltd., Suwon-si, Gyeonggi-do (KR)

(72) Inventors: Seungjin Kim, Hwaseong-si (KR); Jihyun Kim, Hwaseong-si (KR); Taeik Kim, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/290,067

(22) Filed: Mar. 1, 2019

(65) Prior Publication Data
US 2019/0199357 A1    Jun. 27, 2019

Related U.S. Application Data

(63) Continuation of application No. 15/229,499, filed on Aug. 5, 2016, now Pat. No. 10,256,826.

(30) Foreign Application Priority Data

Sep. 24, 2015   (KR) .................. 10-2015-0135834

(51) Int. Cl.
*H03L 7/08*   (2006.01)
*H03L 7/18*   (2006.01)
(Continued)

(52) U.S. Cl.
CPC .............. *H03L 7/0802* (2013.01); *G06F 1/10* (2013.01); *H02M 3/07* (2013.01); *H03K 5/26* (2013.01);
(Continued)

(58) Field of Classification Search
CPC . H03L 7/06; H03L 7/08; H03L 7/0802; H03L 7/087
See application file for complete search history.

(56) References Cited

U.S. PATENT DOCUMENTS

| 5,488,627 A | 1/1996 | Hardin et al. |
| 6,404,834 B1 | 6/2002 | Hardin et al. |

(Continued)

FOREIGN PATENT DOCUMENTS

| JP | 2009-004868 A | 1/2009 |
| KR | 10-1002244 B1 | 12/2010 |

(Continued)

*Primary Examiner* — Hai L Nguyen
(74) *Attorney, Agent, or Firm* — Harness, Dickey & Pierce, P.L.C.

(57) ABSTRACT

A non-linear spread spectrum clock generator using a linear combination may include a phase locked loop configured to receive a reference signal and generate an output signal according to the reference signal and a feedback signal that compensates for the output signal. The phase locked loop may include a divider configured to generate the feedback signal by dividing the output signal by a divisional ratio. The non-linear spread spectrum clock generator may include a non-linear profile generator configured to generate a non-linear signal by selectively outputting selected ones of a plurality of signals according to the absolute magnitudes of the signals and a delta-sigma modulator configured to receive the outputted linear ramp function and to change the divisional ratio. The signals may vary according to different linear ramp functions. The different ramp functions may include different slopes and initiation time values.

20 Claims, 21 Drawing Sheets

(51) Int. Cl.
    *G06F 1/10*     (2006.01)
    *H02M 3/07*     (2006.01)
    *H03K 5/26*     (2006.01)
    *H03L 7/093*    (2006.01)
    *H03L 7/099*    (2006.01)

(52) U.S. Cl.
    CPC .............. *H03L 7/093* (2013.01); *H03L 7/099* (2013.01); *H03L 7/18* (2013.01)

(56) References Cited

U.S. PATENT DOCUMENTS

| | | |
|---|---|---|
| 6,553,057 B1 | 4/2003 | Sha et al. |
| 6,703,902 B2 | 3/2004 | Jeon et al. |
| 6,980,581 B1 | 12/2005 | Sha et al. |
| 7,362,191 B2 | 4/2008 | Chen et al. |
| 7,590,163 B1 | 9/2009 | Miller et al. |
| 7,791,385 B2 | 9/2010 | Huang et al. |
| 7,813,411 B1 | 10/2010 | Li |
| 7,961,059 B1 | 6/2011 | Li |
| 8,072,277 B1 | 12/2011 | Li |
| 8,085,101 B2 * | 12/2011 | Yamamoto .............. H03L 7/087 327/156 |
| 8,269,536 B2 | 9/2012 | Huang et al. |
| 8,319,537 B2 | 11/2012 | Kim et al. |
| 8,378,722 B2 | 2/2013 | Kanda |
| 10,256,826 B2 * | 4/2019 | Kim ........................ H02M 3/07 |
| 2006/0176933 A1 | 8/2006 | Uemura et al. |
| 2008/0122515 A1 | 5/2008 | Oakland |
| 2009/0083567 A1 | 3/2009 | Kim et al. |
| 2009/0179678 A1 | 7/2009 | Hardin et al. |
| 2011/0156782 A1 | 6/2011 | Huang et al. |
| 2014/0269848 A1 | 9/2014 | Schrom et al. |
| 2015/0016491 A1 | 1/2015 | Wong |

FOREIGN PATENT DOCUMENTS

| | | |
|---|---|---|
| KR | 10-1401504 B1 | 6/2014 |
| KR | 10-1447803 B1 | 10/2014 |

* cited by examiner

NON-LINEAR SPREAD SPECTRUM PROFILE GENERATOR USING LINEAR COMBINATION

CROSS-REFERENCE TO RELATED APPLICATIONS

This U.S. non-provisional patent application is a continuation of U.S. patent application Ser. No. 15/229,499, filed on Aug. 5, 2016, now U.S. Pat. No. 10,256,826 issued Apr. 9, 2019, which claims priority under 35 U.S.C. § 119 to Korean Patent Application No. 10-2015-0135834 filed Sep. 24, 2015, in the Korean Intellectual Property Office, the entire contents of each of which are hereby incorporated by reference.

BACKGROUND

The inventive concepts described herein relate to a spread spectrum clock generator, and more particularly, relate to a spread spectrum clock generator generating clocks, of which the frequency is non-linearly changed and which take a non-linear waveform profile, using a plurality of linear combinations.

The technology referred to as "spread spectrum clock generation" is being used to reduce an electromagnetic interference (EMI) phenomenon at an electronic device. That is, the spread spectrum clock generation makes it possible to reduce a peak power by changing an operating frequency with time. In this technology, a profile of a frequency changed according to a time is important to determine the decrement of the peak power.

In some cases, various non-linear profile generating methods have been reported to reduce an electromagnetic interference phenomenon. In some cases, complex circuits are may be used to generate a signal having a non-linear waveform profile. The performance of the spread spectrum clock generator may be reduced due to the complexity of the circuits used to generate the signal. In addition, an increase in circuit complexity may cause an increase in a chip area.

Accordingly, there is a need to develop a method of generating a signal having a non-linear waveform profile using a simple algorithm.

SUMMARY

Some example embodiments of the inventive concepts provide a spread spectrum clock generator which generates clocks, where the spread spectrum clock generator utilizes a non-linear waveform profile signal approximating a non-linear waveform profile, using a plurality of linear combinations.

According to some example embodiments of the inventive concepts, a non-linear spread spectrum clock generator may include a phase locked loop configured to receive a reference signal, wherein to compensate for an output signal of the phase locked loop, the phase locked loop includes a divider configured to receive the output signal and to generate a feedback signal by dividing the output signal by a divisional ratio; and a divisional ratio controller configured to control the divisional ratio. The divisional ratio controller may include a non-linear profile generator and a delta-sigma modulator. The non-linear profile generator may be configured to, generate a plurality of signals having separate magnitudes varying according to separate linear ramp functions, the linear ramp functions having different slopes and initiation time values, and output a non-linear signal having a magnitude varying according to a greatest absolute magnitude of the plurality of signals, such that the output signal has a waveform that approximates a non-linear waveform profile. The delta-sigma modulator may be configured to receive the non-linear signal and control the divisional ratio according to the output signal.

According to some example embodiments of the inventive concepts, a non-linear spread spectrum clock generator may include a phase detector, a non-linear profile generator, a charge pump, a loop filter, and a voltage controlled oscillator. The phase detector may be configured to receive a reference signal and a feedback signal, detect a phase difference between the reference signal and the feedback signal, and generate an up signal and a down signal based on the phase difference. The non-linear profile generator may be configured to generate a plurality of step pulses, each of the step pulses having a non-linearly increasing pulse width, such that the plurality of step pulses approximate a signal having a non-linear profile waveform. The charge pump may be configured to receive the up signal, the down signal, and the step pulses, and generate a control current based on the up signal, the down signal, and the step pulses. The loop filter may be configured to receive the control current, and generate a control voltage based on the control current. The voltage controlled oscillator may be configured to receive the control voltage, and generate an output signal based on the control voltage.

According to some example embodiments of the inventive concepts, a non-linear spread spectrum clock generator may include a phase detector, a charge pump, a loop filter, a non-linear profile generator, and a voltage controlled oscillator. The phase detector may be configured to receive a reference signal and a feedback signal, detect a phase difference between the reference signal and the feedback signal, and output an up signal and a down signal according to the detected phase difference. The charge pump may be configured to receive the up signal and the down signal, and output a control current according to the up signal and the down signal. The loop filter may be configured to receive the control current, and output a control voltage according to the control current. The non-linear profile generator may be configured to generate a plurality of voltage signals having separate magnitudes varying according to separate linear ramp functions, each of the linear ramp functions having separate slopes and initiation time values, and selectively output a linear ramp voltage signal, the selectively outputted linear ramp voltage signal having a greatest absolute magnitude of the plurality of voltage signals, such that the selectively outputted linear ramp voltage signal approximates a voltage signal having a non-linear profile waveform. The voltage controlled oscillator may be configured to receive the control voltage and the selectively outputted linear ramp voltage, and output an output signal according to the control voltage and the selectively outputted linear ramp voltage.

According to some example embodiments of the inventive concepts, an apparatus may include a non-linear profile generator. The non-linear profile generator may be configured to generate a plurality of signals, the signals having separate magnitudes varying according to separate linear ramp functions, the separate linear ramp functions having different slopes and different initiation time values; and output a non-linear signal having a magnitude varying according to a greatest absolute magnitude of the plurality of signals, such that the outputted non-linear signal has a waveform that approximates a non-linear waveform profile.

In some example embodiments, the non-linear profile generator may be a Hershey-Kiss profile generator configured to output the non-linear signal having the magnitude varying according to a greatest absolute magnitude of the plurality of signals such that the outputted non-linear signal is a Hershey-Kiss signal that has a waveform that approximates a Hershey-Kiss profile.

In some example embodiments, the Hershey-Kiss profile generator may include a plurality of linear ramp function generators configured to generate separate signals of the plurality of signals; and a digital multiplexer configured to output a selected signal of the plurality of signals as the Hershey-Kiss signal, based on the selected signal having the greatest absolute magnitude of the plurality of signals.

In some example embodiments, the digital multiplexer may include a plurality of comparators configured to receive separate signals of the plurality of signals, respectively.

In some example embodiments, the Hershey-Kiss profile generator may be configured to discontinue generating at least one signal of the plurality of signals concurrently with initiating generating another signal of the plurality of signals.

In some example embodiments, the apparatus may further include a phase locked loop configured to generate an output signal according to a received reference signal and the Hershey-Kiss signal. The phase locked loop may include a divider configured to generate a feedback signal based on dividing the output signal by a divisional ratio; and a divisional ratio controller configured to control the divisional ratio according to the Hershey-Kiss signal.

In some example embodiments, the phase locked loop may further include a phase detector, a charge pump, a loop filter, and a voltage controlled oscillator. The phase detector may be configured to receive the reference signal and the feedback signal, detect a phase difference between the reference signal and the feedback signal, and generate an up signal and a down signal according to the detected phase difference. The charge pump may be configured to receive the up signal and the down signal, and generate a control current based on the up signal and the down signal. The loop filter may be configured to receive the control current, and output a control voltage based on the control current. The voltage controlled oscillator may be configured to receive the control voltage, and generate the output signal based on the control voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1A:
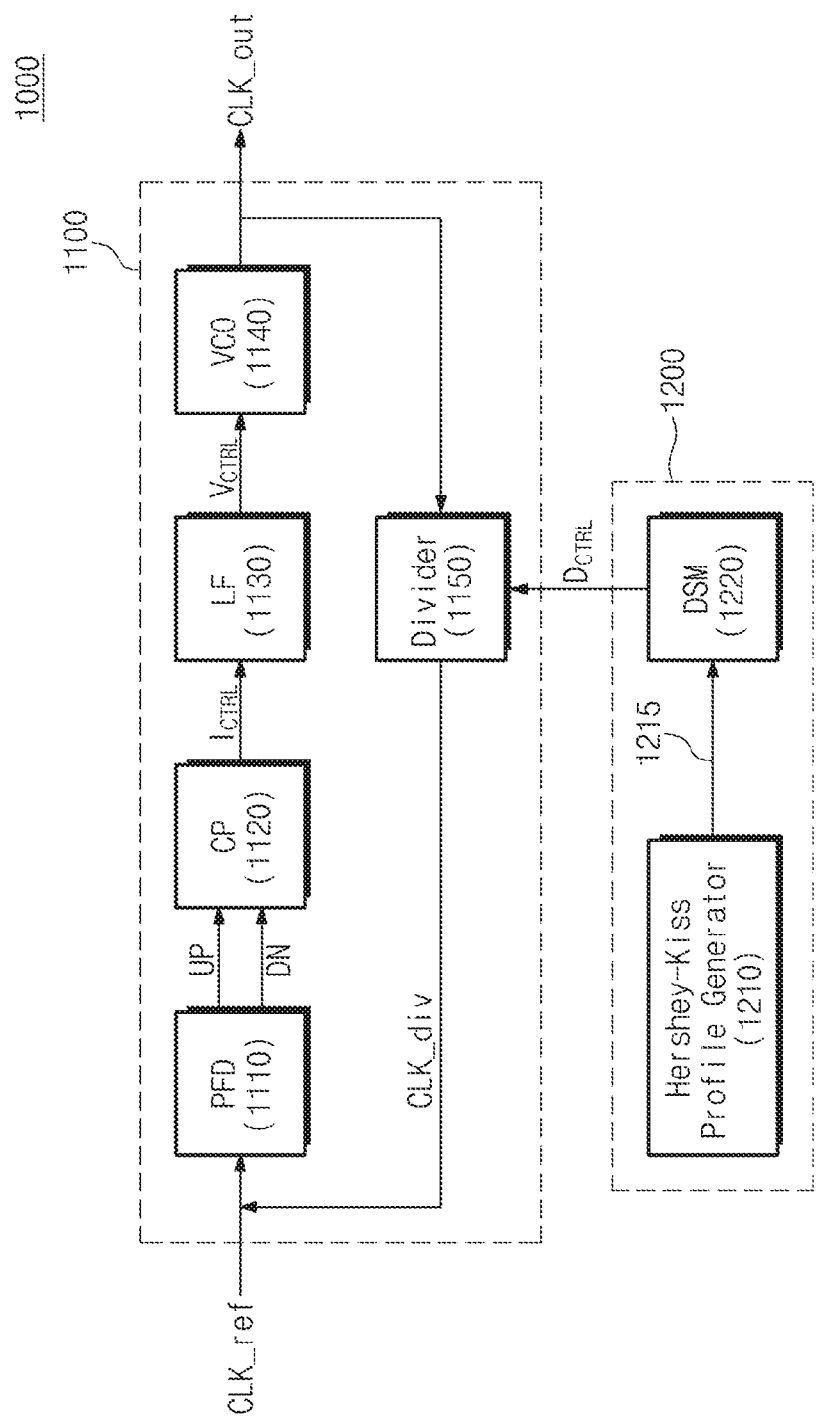
FIG. 1A is a block diagram illustrating a spread spectrum clock generator according to some example embodiments of the inventive concepts.

It is to be understood that both the foregoing general description and the following detailed description are provided as examples, for illustration and not for limiting the scope of the example embodiments. Reference will now be made in detail to the present preferred embodiments of the example embodiments, examples of which are illustrated in the accompanying drawings. Wherever possible, the same reference numbers are used in the drawings and the description to refer to the same or like parts.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. As used herein, the term "and/or," includes any and all combinations of one or more of the associated listed items.

Even though the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The terminology used herein is for the purpose of describing particular embodiments only and is not intended to be limiting of example embodiments of the example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Below, embodiments of the inventive concepts will be described with reference to accompanying drawings in order to describe the embodiments of the inventive concepts in detail to the extent that one skilled in the art can easily implement the scope and spirit of the inventive concepts.

Figure 1B:
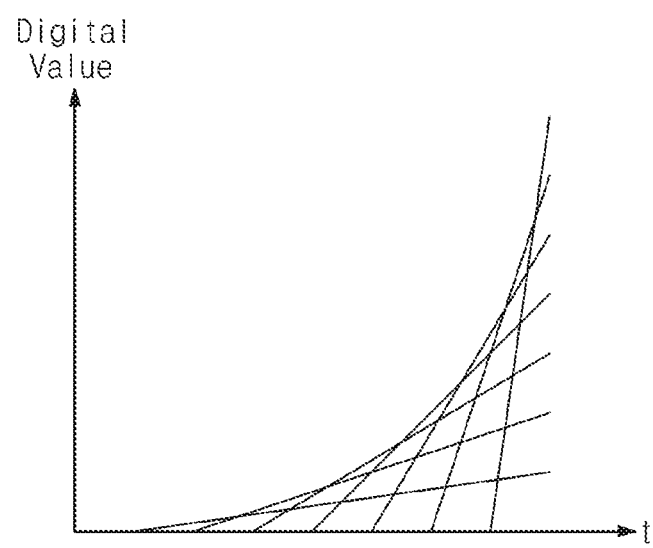
FIG. 1B is a graphic of a waveform having a Hershey-Kiss profile according to some example embodiments of the inventive concepts.

FIG. 1A is a block diagram illustrating a spread spectrum clock generator according to some example embodiments of the inventive concepts. FIG. 1B is a graphic of a waveform having a Hershey-Kiss profile according to some example embodiments of the inventive concepts. A spread spectrum clock generator 1000 may include a phase locked loop 1100 and a divisional ratio control circuit 1200.

Referring to FIG. 1A, the phase locked loop 1100 may include a phase frequency detector 1110, a charge pump 1120, a loop filter 1130, a voltage controlled oscillator 1140, and a divider 1150. The phase locked loop 1100 may stabilize a phase of an output signal CLK_out so as not to be changed. Moreover, to reduce an electromagnetic interference (EMI), the phase locked loop 1100 may modulate the reference signal CLK_ref such that a frequency-time graph of the output signal CLK_out takes a non-linear waveform profile.

The phase frequency detector 1110 may receive the reference signal CLK_ref and a feedback signal CLK_div, may compare a frequency of the reference signal CLK_ref with a frequency of the feedback signal CLK_div, and may compare a phase of the reference signal CLK_ref with a phase of the feedback signal CLK_div. For example, when the phase of the reference signal CLK_ref leads a phase of the feedback signal CLK_div, the phase frequency detector 1110 may output an up signal UP of logic 1 and a down signal DN of logic 0. On the other hand, when a phase of the reference signal CLK_ref lags behind a phase of the feedback signal CLK_div, the phase frequency detector 1110 may output the up signal UP of logic 0 and the down signal DN of logic 1. For example, the feedback signal CLK_div may be a signal obtained by dividing the output signal CLK_out by 1/N. Here, 'N' may be a divisional ratio of the divider 1150.

The charge pump 1120 may receive the up signal UP and the down signal DN and may generate a control current ICTRL based on the up signal UP and the down signal DN. The charge pump 1120 may include at least one current source, at least two switches which operate in response to the up signal UP and the down signal DN, and at least one capacitor. The charge pump 1120 is an example. However, the scope and spirit of the inventive concepts may not be limited thereto. For example, the charge pump 1120 may be implemented with various configurations each of which converts a signal inputted to the charge pump 1120 into a current.

The loop filter 1130 may operate as a differentiator or an integrator which converts the control current ICTRL outputted from the charge pump 1120 into a control voltage VCTRL. Moreover, the loop filter 1130 may remove a high frequency component from a signal (i.e., the control current ICTRL) outputted from the charge pump 1120. That is, the loop filter 1130 may operate as a low pass filter. For example, the loop filter may include at least one capacitor and at least one resistor. The loop filter 1130 is an example. However, the scope and spirit of the inventive concepts may not be limited thereto. For example, the loop filter 1130 may be implemented with various configurations each of which operates as a differentiator or an integrator or may operate as a low pass filter.

The voltage controlled oscillator 1140 may receive the control voltage VCTRL and may output the output signal CLK_out using the control voltage VCTRL. At this time, a frequency-to-time graph about the control voltage VCTRL may be changed to take a waveform of a control voltage VCTRL-to-time graph. For example, if the waveform of the control voltage VCTRL-to-time graph takes the Hershey-Kiss profile, the frequency-to-time graph about the output signal CLK_out may also take the Hershey-Kiss profile.

The divider 1150 may receive the output signal CLK_out and may divide the output signal CLK_out by the divisional ratio 'N'. That is, to precisely control the reference signal CLK_ref, the divider 1150 may adjust a frequency of an input signal (i.e., the feedback signal CLK_div) of the phase frequency detector 1110 by dividing the output signal CLK_out by 'N' which is an integer of 1 or more. The divider 1150 may output a signal, which is generated by dividing the output signal CLK_out by 'N', as the feedback signal CLK_div.

The phase locked loop 1100 may repeat operations of the above-described components, thereby making it possible to stabilize the output signal CLK_out. However, according to some example embodiments of the inventive concepts, various control methods may be used such that the waveform of the frequency-to-time graph about the output signal CLK_out takes the Hershey-Kiss profile. A waveform that "takes" the Hershey-Kiss profile may herein refer to a waveform that at least "approximates" the Hershey-Kiss profile. A method of changing the divisional ratio N of the divider 1150 in real time may be used as one of the various control methods.

The divisional ratio control circuit 1200 may be provided to change the divisional ratio N in real time. The divisional ratio control circuit 1200 may include a Hershey-Kiss profile generator 1210 and a delta-sigma modulator 1220.

The Hershey-Kiss profile generator 1210 may output a Hershey-Kiss signal 1215, where the signal 1215 is a combination of a plurality of signals varying according to different linear ramp functions having different slopes. As shown in FIG. 1B, a waveform of a digital value-to-time graph of the signal 1215 outputted by the Hershey-Kiss profile generator 1210 may take ("approximate") the Hershey-Kiss profile. As a result, the waveform of the frequency-to-time graph about the output signal CLK_out (the waveform of the output signal CLK_out) may take ("approximate") the Hershey-Kiss profile. This will be described with reference to FIG. 4.

The delta-sigma modulator 1220 may receive the signal 1215 generated by the Hershey-Kiss profile generator 1210 and may transfer a control signal DCTRL to the divider 1150. Generally, the divisional ratio 'N' which the divider 1150 has may be a natural number. However, in some cases, the divisional ratio N of a decimal value needs to adjust a waveform of the output signal CLK_out so as to take the Hershey-Kiss profile. The delta-sigma modulator 1220 may be used to obtain the above-described result.

According to some example embodiments of the inventive concepts, a non-linear Hershey-Kiss profile (e.g., a profile that approximates the Hershey-Kiss profile) may be generated using a combination of signals having different waveforms according to different linear ramp functions having different voltage slopes. As a result, it may be possible to simplify a configuration of a circuit and an algorithm and to improve an operating speed.

In some example embodiments, the Hershey-Kiss profile generator 1210 is a non-linear profile generator that may output a non-linear output signal 1215, where the signal 1215 is a combination of a plurality of signals varying according to different linear ramp functions having different slopes. A waveform of a digital value-to-time graph of the non-linear signal 1215 outputted by the non-linear profile generator 1210 may take ("approximate") a non-linear waveform profile. For example, the non-linear signal 1215 may approximate a sinusoidal waveform profile. As a result, the waveform of the frequency-to-time graph about the output signal CLK_out (the waveform of the output signal CLK_out) may take ("approximate") the non-linear waveform profile.

The delta-sigma modulator 1220 may receive the non-linear signal 1215 generated by the non-linear profile generator 1210 and may transfer a control signal DCTRL to the divider 1150. Generally, the divisional ratio 'N' which the divider 1150 has may be a natural number. However, in some cases, the divisional ratio N of a decimal value needs to adjust a waveform of the output signal CLK_out so as to take the non-linear waveform profile. The delta-sigma modulator 1220 may be used to obtain the above-described result.

According to some example embodiments of the inventive concepts, a non-linear waveform profile (e.g., a profile that approximates the non-linear waveform profile) may be generated using a combination of signals having different waveforms according to different linear ramp functions having different voltage slopes. As a result, it may be possible to simplify a configuration of a circuit and an algorithm and to improve an operating speed. The non-linear waveform profile may be a Hershey-Kiss profile, such that the non-linear profile generator 1210 is a Hershey-Kiss profile generator 1210 as shown in FIG. 1A.

Figure 2:
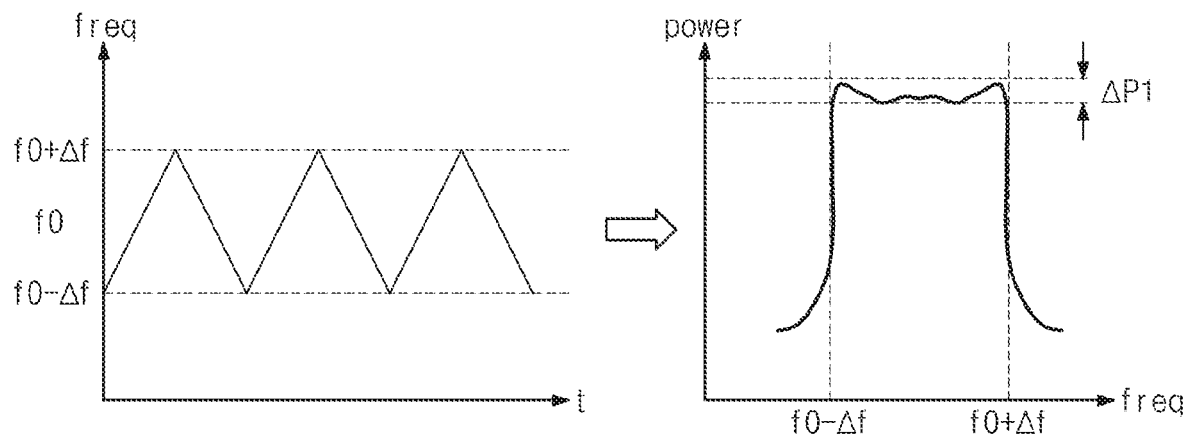
FIG. 2 is a graph illustrating a profile of a triangle wave and a spectrum thereof according to some example embodiments of the inventive concepts.
Figure 3:
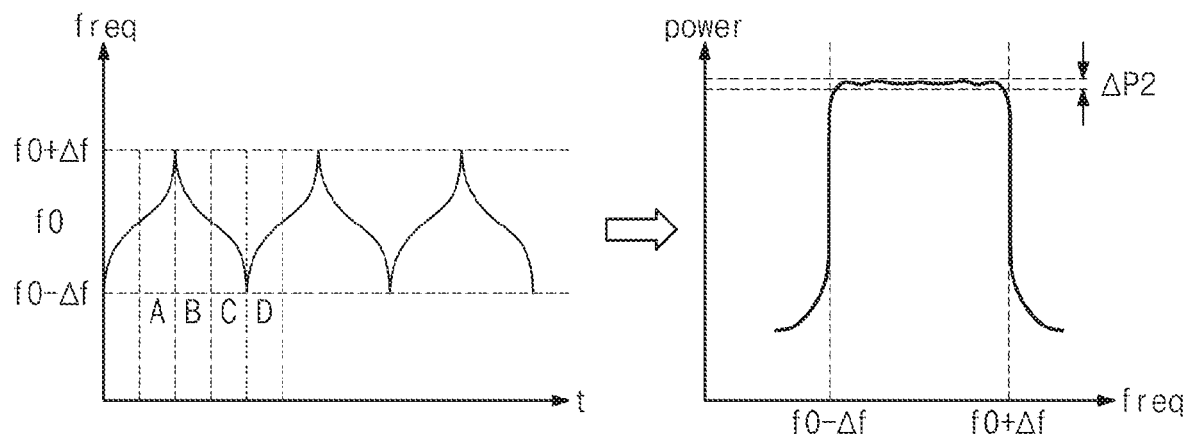
FIG. 3 is a graph illustrating a Hershey-Kiss profile and a spectrum thereof according to some example embodiments of the inventive concepts.

FIG. 2 is a graph illustrating a profile and a spectrum of a triangle wave according to some example embodiments of the inventive concepts. FIG. 3 is a graph illustrating a Hershey-Kiss profile and a spectrum thereof according to some example embodiments of the inventive concepts.

Referring to FIG. 2, a triangle wave in which a frequency periodically increases or decreases according to a time by $\Delta f$ with a center frequency f0 as the center is illustrated. It is understood from a spectrum of the triangle wave at a frequency domain that a power is changed by $\Delta P1$ while a frequency is changed between 'f0−$\Delta f$' and 'f0+$\Delta f$'. On the other hand, referring to FIG. 3, a Hershey-Kiss profile in which a frequency periodically increases or decreases according to a time by $\Delta f$ with the center frequency f0 as the center is illustrated. Likewise, it is understood from a spectrum of the Hershey-Kiss profile at a frequency domain that a power is changed by $\Delta P2$ while a frequency is changed between 'f0−$\Delta f$' and 'f0+$\Delta f$'.

While a frequency is changed according to a time, intensity of an electromagnetic interference may be determined according to a maximum value of a changing power. That is, while a frequency is changed with the course of time, as the maximum value of the changing power becomes small, an electromagnetic interference influence may be reduced. In a triangle wave, a changing power may have a maximum value at a point in time when a frequency is about 'f0−$\Delta f$' or 'f0+$\Delta f$'. On the other hand, in the Hershey-Kiss profile, the maximum value of a changing power may be smaller than the maximum value of the triangle wave. Moreover, even though there is a difference of $\Delta P2$, in the Hershey-Kiss profile, a relatively constant power value may be maintained at the whole area between 'f0−$\Delta f$' and 'f0+$\Delta f$'. In the Hershey-Kiss profile, because a time when frequencies near 'f0−$\Delta f$' and 'f0+$\Delta f$' are maintained is short, fluctuations in the maximum value of a changing power at a frequency domain may be relatively small, and thus a generally stable power may be obtained. As a result, a clock taking the Hershey-Kiss profile may be used, thereby making it possible to reduce an electromagnetic interference influence. Below, a configuration and a method which allow an output waveform of the voltage controlled oscillator 1140 (refer to FIG. 1) to take the Hershey-Kiss profile will be described.

Figure 4:
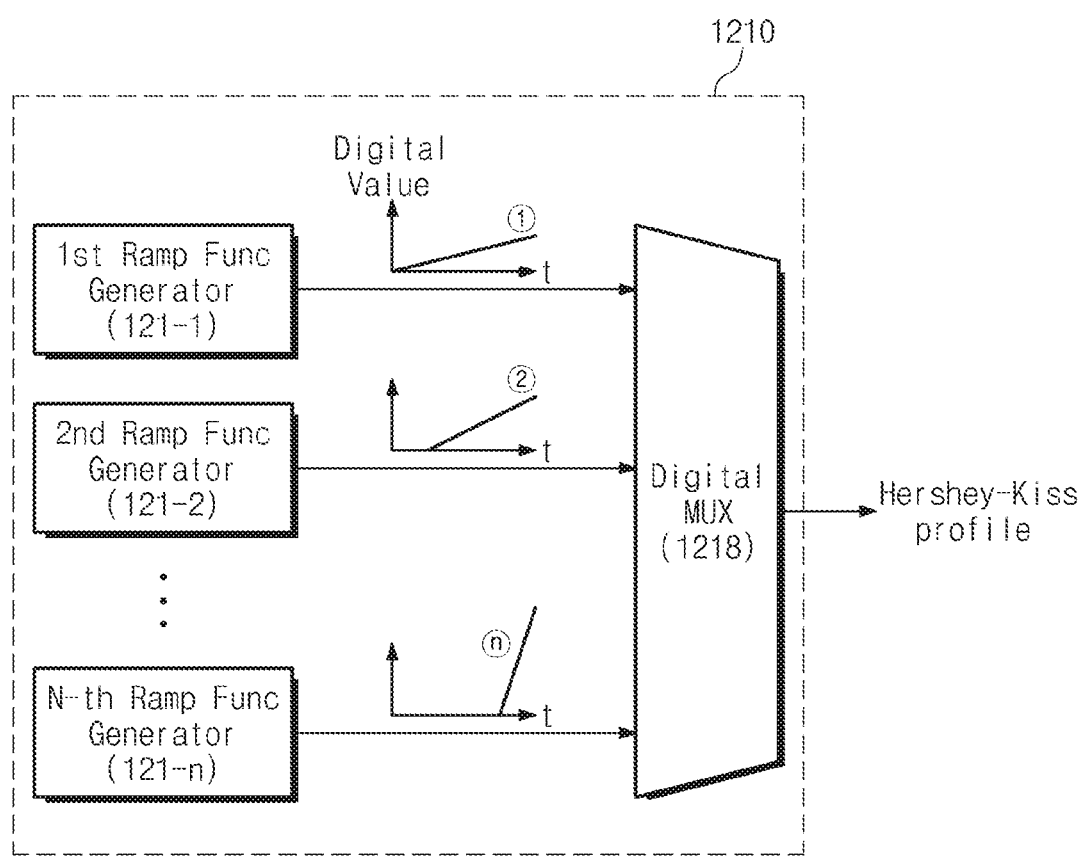
FIG. 4 is a block diagram illustrating a non-linear profile generator illustrated in FIG. 1.

FIG. 4 is a block diagram illustrating a non-linear profile generator 1210 illustrated in FIG. 1. Referring to FIG. 4, a non-linear profile generator 1210, which may include a Hershey-Kiss profile generator 1210, may include a plurality of ramp function generators 121-1 to 121-n, and a digital multiplexer 1218.

Each of the ramp function generators 121-1 to 121-n may generate a separate signal that varies according to a separate linear ramp function (also referred to herein as a separate signal having a separate waveform according to a separate linear ramp function), respectively. Separate linear ramp functions may have different slopes, relative to one another. Moreover, time points at which the linear ramp functions are initially generated (also referred to herein as "initiation time values") may be different, relative to one another. For example, a signal having a waveform according to a linear ramp function having a slope of a great value may be generated later than a signal having a waveform according to a linear ramp function having a slope of a small value.

The first to n-th ramp function generators 121-1 to 121-n are described with reference to FIG. 4. For example, the first ramp function generator 121-1 may generate a signal that varies according to a first linear ramp function corresponding to ①. The signal generated by the first ramp function generator 121-1 may vary according to a first linear ramp function with a slope, which has the smallest value, from among slopes of ramp functions of signals generated by the ramp function generators 121-1 to 121-*n*, respectively. Moreover, the second ramp function generator 121-2 may generate a signal that varies according to a second linear ramp function corresponding to ②. A slope of the second linear ramp function may be greater than that of the first linear ramp function. Moreover, the signal that varies according to the second linear ramp function may be generated later than the signal that varies according to the first linear ramp function. Lastly, the n-th linear ramp function generator 121-*n* may generate a signal that varies according to an n-th linear ramp function corresponding to ⓝ. The n-th linear ramp function may have a slope, which has the greatest value, from among slopes of ramp functions of signals generated by the ramp function generators 121-1 to 121-*n*, respectively. Moreover, the signal that varies according to the n-th linear ramp function may be generated later than the signals that vary according to the first to (n−1)-th linear ramp functions.

The digital multiplexer 1218 may receive a plurality of signals that vary according to separate linear ramp functions and which are generated by the ramp function generators 121-1 to 121-*n*, respectively. Moreover, the digital multiplexer 1218 may be configured to output, at a given time, a signal, that varies according to a ramp function, of which the absolute value ("absolute magnitude") is the greatest, from among the absolute magnitudes of the plurality of generated signals at the given time.

Figure 5:
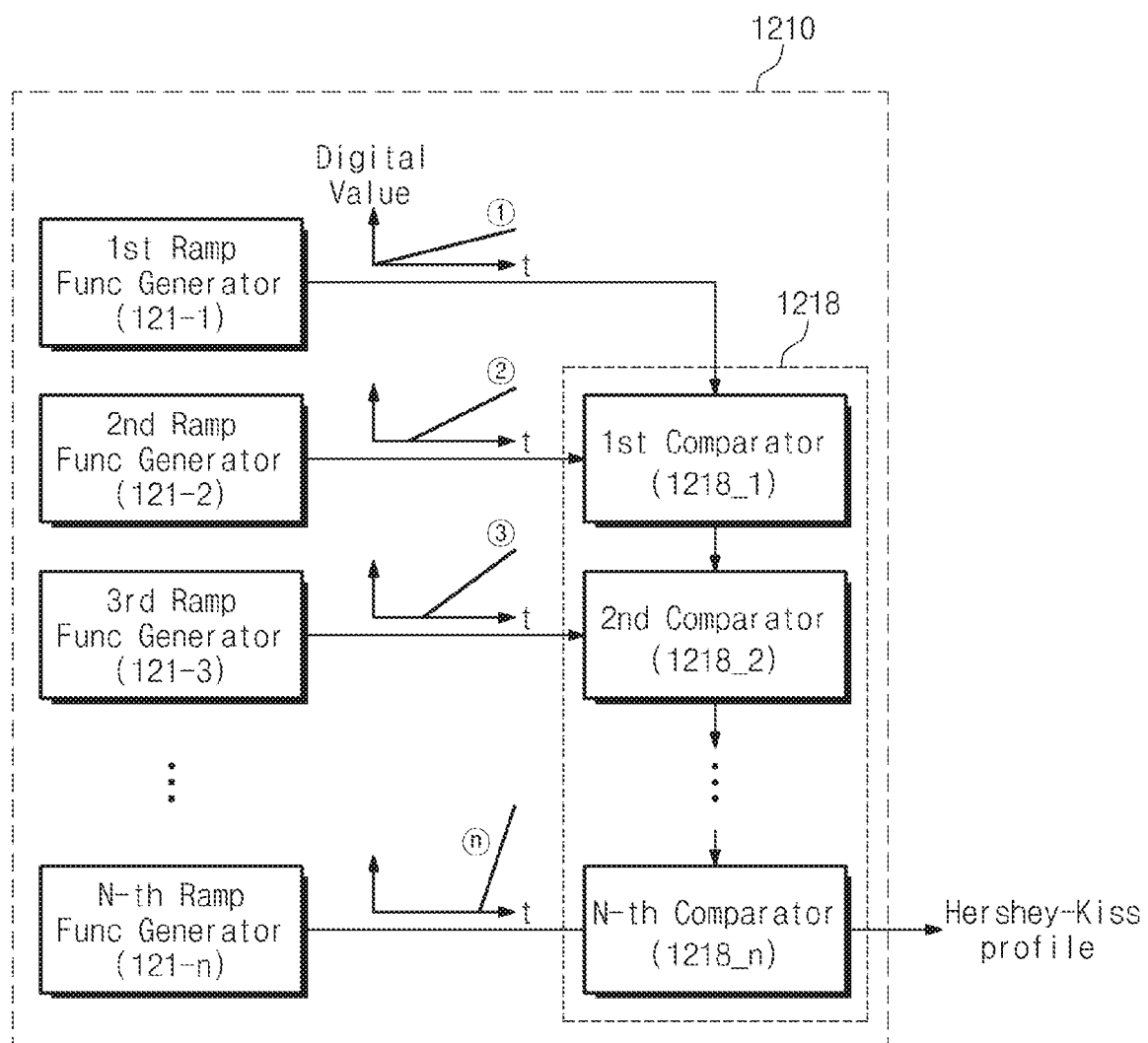
FIG. 5 is a block diagram illustrating a non-linear profile generator illustrated in FIG. 4.

FIG. 5 is a block diagram illustrating a non-linear profile generator 1210 illustrated in FIG. 4. The non-linear profile generator 1210 may be a Hershey-Kiss profile generator. As described above, the non-linear profile generator 1210 may be an example for outputting a signal that varies according to a ramp function (as a result, a digital value) of which the absolute value is the greatest at any given time. The digital multiplexer 1218 of FIG. 4 may include a plurality of comparators 1218_1 to 1218_*n*−1. The first comparator 1218_1 may be configured to compare digital values of signals received from the ramp function generators 121-1 and 121-2. Each of comparators 1218_2 to 1218_*n* may be configured to compare digital values of signals received from a corresponding ramp function generator and a corresponding preceding comparator. For example, comparator 1218_2 may be configured to compare digital values of signals received from the second ramp function generator 121-2 and the first comparator 1218_1. As a result, a signal that varies according to a ramp function, of which the absolute value ("absolute magnitude") is the greatest, from among a plurality of linear ramp functions may be selectively outputted. In some example embodiments, the comparators 1218_1 to 1218_*n*−1 may be an embodiment of the digital multiplexer 1218 of FIG. 4. However, the scope and spirit of the inventive concepts may not be limited thereto. For example, the digital multiplexer 1218 may include various configurations, each of which is configured to output a signal that has the greatest digital value ("absolute magnitude") of digital values outputted via signals from the ramp function generators.

Figure 6:
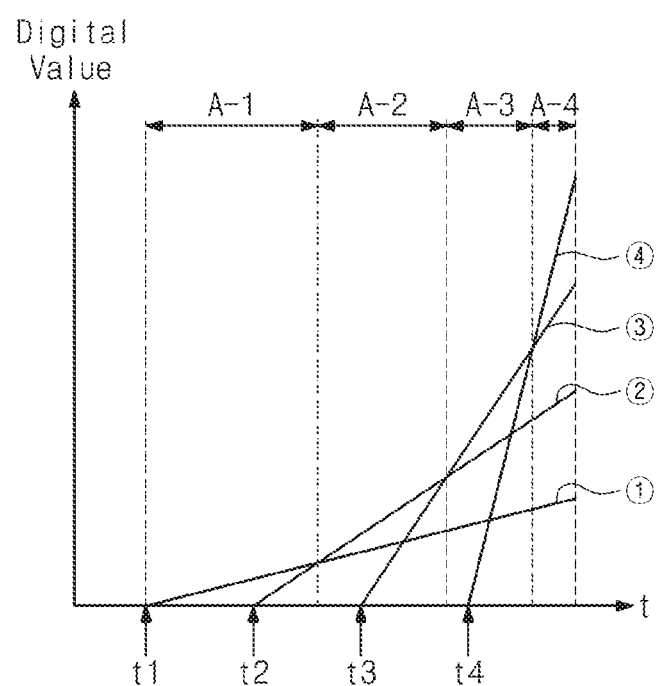
FIG. 6 is a graph illustrating a waveform of a digital value outputted from a non-linear profile generator in FIG. 4 or 5.

FIG. 6 is a graph illustrating a waveform of a signal that varies according to a digital value outputted from a non-linear profile generator according to some example embodiments. A method of generating a waveform corresponding to interval A of FIG. 3 will be described in FIG. 6. For descriptive convenience, it is assumed that four ramp function generators are used.

A first ramp function generator 121-1 may generate a signal that varies according to a first linear ramp function corresponding to ① at time T1. A second ramp function generator 121-2 may generate a signal that varies according to a second linear ramp function corresponding to ② at time T2. A third ramp function generator 121-3 may generate a signal that varies according to a third linear ramp function corresponding to ③ at time T3. Lastly, a fourth ramp function generator 121-4 may generate a signal that varies according to a fourth linear ramp function corresponding to ④ at time T4. Digital values of signals respectively outputted from the first to fourth ramp function generators 121-1 to 121-4 may be inputted to the comparators 1218_1 to 1218_4, respectively. The non-linear profile generator 1210 may output a signal having a digital value ("absolute magnitude") that is the greatest of the digital values of the signals outputted by the first to fourth ramp function generators 121-1 to 121-4.

In a graph of FIG. 6, at time interval A-1, because a value ("absolute magnitude") of the signal (1) that varies according to the first linear ramp function is the highest ("greatest") of the plurality of signals (1)-(4), the signal (1) may be outputted by the generator 1210. At time interval A-2, because a value ("absolute magnitude") of the signal (2) that varies according to the second linear ramp function is the ("greatest") of the plurality of signals (1)-(4), the signal (2) may be outputted by the generator 1210. At time interval A-3, because a value ("absolute magnitude") of the signal (3) that varies according to the third linear ramp function is the ("greatest") of the plurality of signals (1)-(4), the signal (3) may be outputted by the generator 1210. Lastly, at time interval A-4, because a value ("absolute magnitude") of the signal (4) that varies according to the fourth linear ramp function is the highest ("greatest") of the plurality of signals (1)-(4), the signal (4) may be outputted by the generator 1210. Because only four linear combinations are used, a total waveform of the signal outputted by the generator 1210 may be roughly expressed ("approximated"). However, it is understood that a rough ("approximate") waveform of an output value of the outputted signal is associated with a non-linear waveform profile. The non-linear waveform profile may be a Hershey-Kiss profile.

Figure 7:
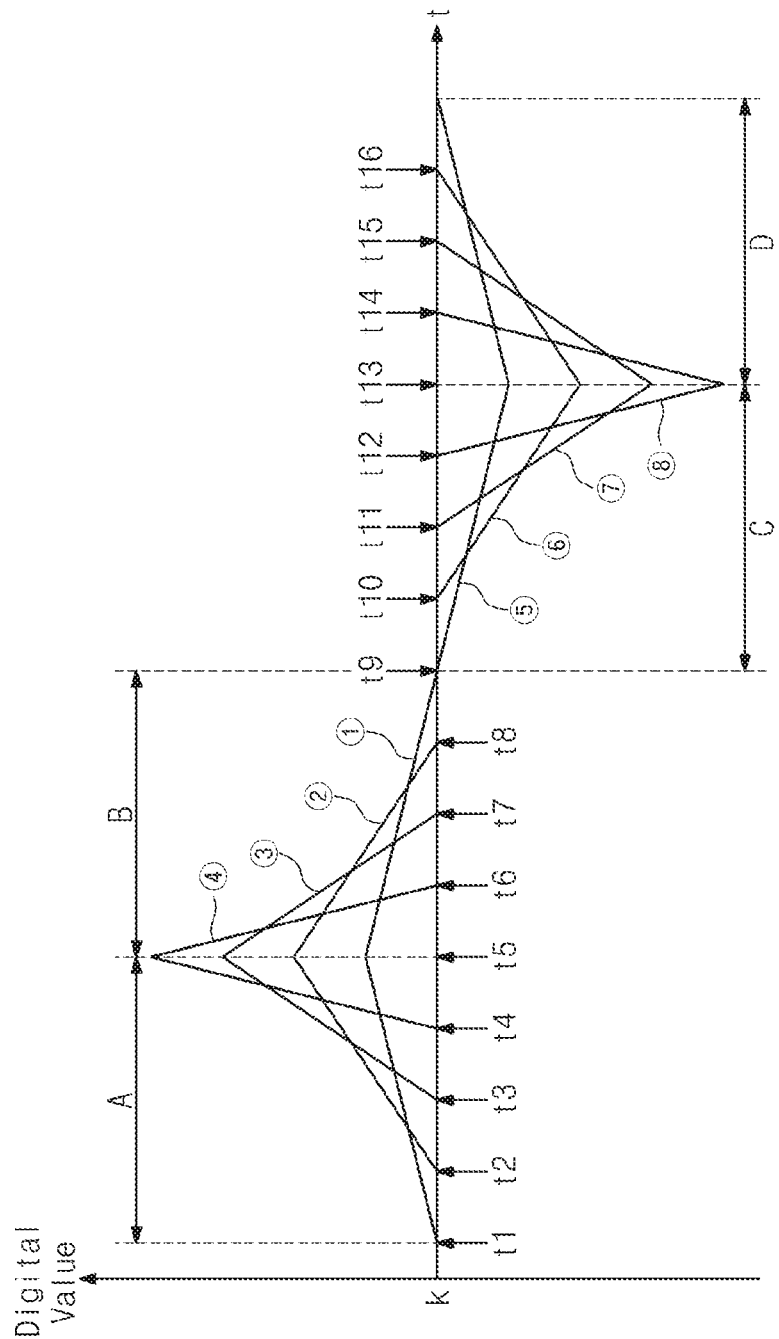
FIG. 7 is a graph illustrating an overall waveform of a digital value outputted from a non-linear profile generator in FIG. 4 or 5.

FIG. 7 is a graph illustrating an overall waveform of a Hershey-Kiss signal outputted from a non-linear profile generator in FIG. 4 or 5. A graph corresponding to interval A illustrated in FIG. 7 may be equal to a graph illustrated in FIG. 6. Moreover, intervals B, C, and D may correspond to intervals B, C, and D illustrated in FIG. 3. As illustrated in FIG. 7, a signal generated by a Hershey-Kiss profile generator 1210 ("Hershey-Kiss signal") may have a digital value ("magnitude") that periodically increases or decreases based on a value 'k'. Moreover, a digital value generated by the Hershey-Kiss profile generator 1210 may be greater than '0'.

According to some example embodiments of the inventive concepts, each of the ramp function generator 121-1 to 121-4 may generate a signal that varies according to a separate, respective ramp function four times such that a waveform of a signal outputted from the Hershey-Kiss profile generator 1210 has a complete Hershey-Kiss profile. For example, the first ramp function generator 121-1 may generate a signal that varies according to a first ramp function (corresponding to ① and ⑤ in FIG. 7) at times t1, t5, t9, and t13. As the first ramp function generator 121-1 generates the signal that varies according to the first ramp function, the fourth ramp function generator 1214 may generate a signal that varies according to a fourth ramp function (corresponding to ④ and ⑧ in FIG. 7) at times t4, t5, t12, and t13. In contrast, the signal generated by the first ramp function generator 121-1 may vary continuously at intervals B and C, and a slope of the first linear ramp function at interval B may be equal to a slope of the first linear ramp function at interval C. Accordingly, the first ramp function generator 121-1 may generate a signal that varies according to a ramp value (i.e., the first linear ramp function) at least three times.

After a signal having a non-linearly increasing digital value taking the Hershey-Kiss profile at interval A is generated, a signal having a non-linearly decreasing digital value taking the Hershey-Kiss profile at interval B may be generated. A method in which a plurality of linear ramp functions is generated at interval B may be similar to a method described with reference to FIGS. 4 to 6. However, the ramp function generators 121-1 to 121-4 may respectively generate a plurality of signals varying according to separate linear ramp functions at t5. Moreover, slopes about the generated signals may be different from each other, and generation intervals about the generated signals may be different from each other. For example, the first signal ① generated by the first ramp function generator 121-1 may vary according to a negative slope of which the absolute value is the smallest. Moreover, an interval during which a signal having a digital value (i.e., the first signal ①) is outputted may be 't9-t5' and may be the longest. In addition, the signal varying according to the fourth linear ramp function ④ generated by the fourth ramp function generator 121-4 may vary according to a negative slope of which the absolute value is the greatest. Moreover, an interval during which a signal having a digital value (i.e., the signal ④) is outputted may be 't6-t5' and may be the shortest.

In some example embodiments, a signal having a non-linearly decreasing digital value taking the Hershey-Kiss profile at interval C may be generated. Referring to FIG. 7, a slope of the first linear ramp function of signal ① outputted at interval B may be equal to a slope of the fifth linear ramp function of signal ⑤ outputted at interval C Likewise, a slope of the second linear ramp function of signal ② outputted at interval B may be equal to a slope of the sixth linear ramp function of signal ⑥ outputted at interval C. A slope of the third linear ramp function of signal ③ outputted at interval B may be equal to a slope of the seventh linear ramp function of signal ⑦ outputted at interval C. A slope of the fourth linear ramp function of signal ④ outputted at interval B may be equal to a slope of the eighth linear ramp function of signal ⑧ outputted at interval C.

The first ramp function generator 121-1 may generate the signal varying according to the fifth linear ramp function ⑤ having a negative slope at time t9. At interval C, the signal varying according to the fifth linear ramp function ⑤ may be maintained until time t13. The signal varying according to the fifth linear ramp function ⑤ may have a negative slope, of which the absolute value is the smallest, from among slopes of the signals varying according to the linear ramp functions generated at interval C and may be earliest generated.

As the signal varying according to the fifth linear ramp function ⑤ is generated, at time t12, the fourth ramp function generator 121-4 may generate the signal varying according to the eighth linear ramp function ⑧ having a negative slope and negative digital values. The signal varying according to the eighth linear ramp function ⑧ may have been maintained until time t13. The signal varying according to the eighth linear ramp function ⑧ may have a negative slope, of which the absolute value is the greatest, from among slopes of the signals varying according to the linear ramp functions generated at interval C and may be latest generated. In some example embodiments, a digital value of a signal varying according to the eighth linear ramp function ⑧ at time t13 may be the smallest of digital values of signals generated by a Hershey-Kiss profile generator.

At interval D, a signal having a non-linearly increasing digital value taking a Hershey-Kiss profile may be generated. Referring to FIG. 7, a slope of the first linear ramp function of signal ⑤ outputted at interval D may be equal to the first linear ramp function of signal ① outputted at interval A Likewise, a slope of the sixth linear ramp function of signal ⑥ outputted at interval D may be equal to the second linear ramp function of signal ② outputted at interval A. A slope of the seventh linear ramp function of signal ⑦ outputted at interval D may be equal to the third linear ramp function of signal ③ outputted at interval A. A slope of the eighth linear ramp function of signal ⑧ outputted at interval D may be equal to the fourth linear ramp function of signal ④ outputted at interval A. A signal outputted at interval D may have a positive slope such that the value of the signal increases over time during the time interval D.

As illustrated in FIG. 7, a point in time when a signal varying according to a ramp function is generated, a point in time when the generation of the signal varying according to the ramp function is ended, a slope, and the like may be adjusted to output a signal having a non-linearly increasing digital value. At time interval D, the signals varying according to the fifth to eighth linear ramp functions ⑤ to ⑧ may be generated so as to have a positive slope at the same time (i.e., time t13). However, an absolute value about a slope of the fifth linear ramp function of signal ⑤ may be the smallest, and an absolute value about a slope of the eighth linear ramp function of signal ⑧ may be the greatest. A non-linearly increasing digital value of the signal having the Hershey-Kiss profile may be outputted by controlling the ramp function generators 121-1 to 121-n so as to generate signals having digital values illustrated at time interval D.

A signal that varies according to a linear ramp function of which an absolute value about a digital value generated at intervals A to D is the greatest may be outputted from the non-linear profile generator 1210 using the above-described configuration and method. That is, a digital value-to-time graph of a signal outputted from the non-linear profile generator 1210 may be similar to a waveform of the frequency-to-time graph of FIG. 3. The delta-sigma modulator 1220 (refer to FIG. 1) may generate the control signal DCTRL using the digital value of the signal outputted from the non-linear profile generator 1210 and may control a divisional ratio of the divider 1150 (refer to FIG. 1) based on the control signal DCTRL. As a result, the output signal CLK_out outputted from the phase locked loop 1100 may have a value that varies according to the non-linear waveform profile illustrated in the frequency-to-time graph of FIG. 3.

According to some example embodiments of the inventive, a signal having a value that varies according to a non-linear waveform profile may be generated by combining a plurality of signals that vary according to a plurality of linear ramp functions, thereby implementing a spread spectrum clock generator which makes it possible to reduce an electromagnetic interference phenomenon. Moreover, the non-linear waveform profile of the signal value may be implemented using a linear combination without a configuration of a complex circuit or a complex operation, thereby making it possible to reduce a chip size and to improve an operating speed.

Figure 8:
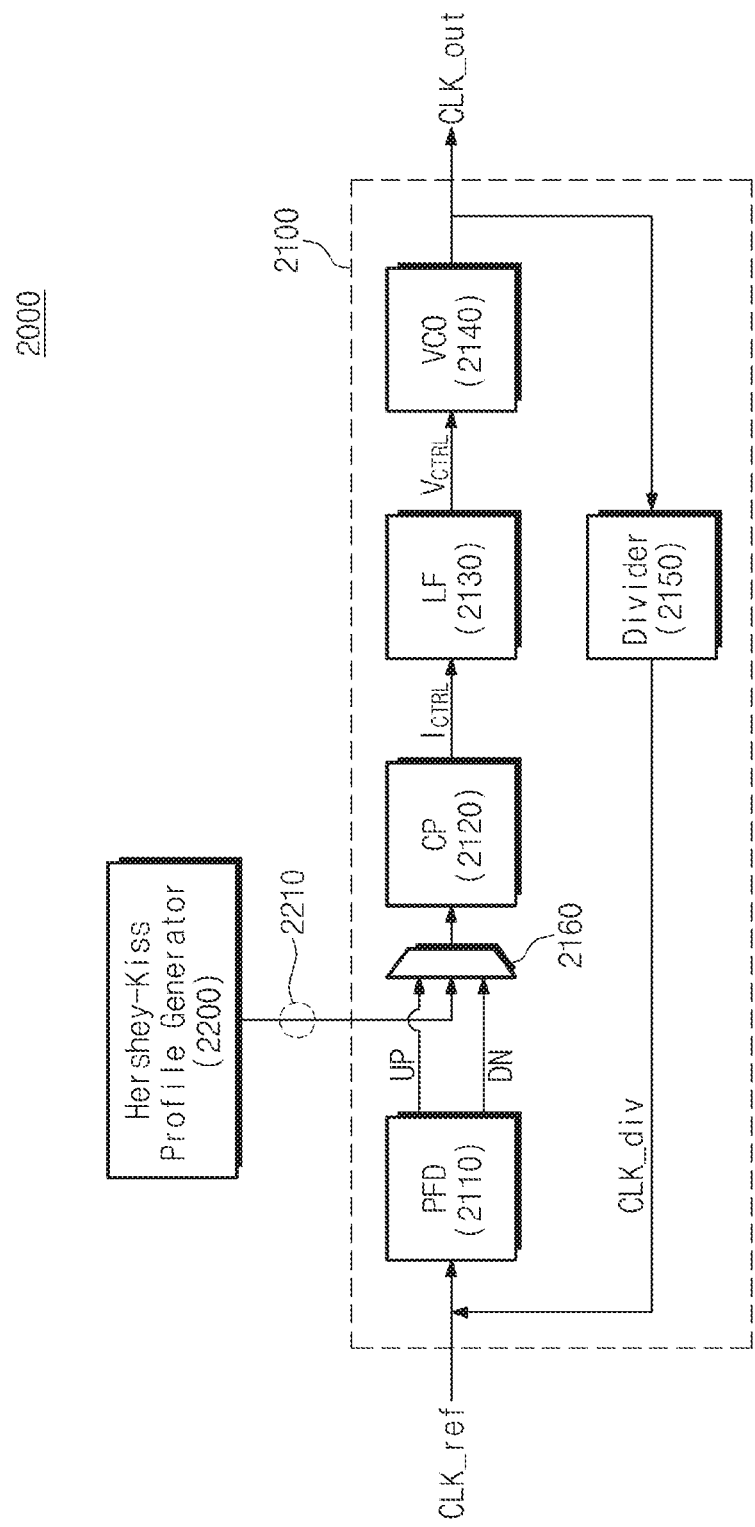
FIG. 8 is a block diagram illustrating a spread spectrum clock generator according to some example embodiments of the inventive concepts.

FIG. 8 is a block diagram illustrating a spread spectrum clock generator 2000 according to some example embodiments of the inventive concepts. A spread spectrum clock generator 2000 may include a phase locked loop 2100 and a non-linear profile generator 2200. As shown in FIG. 8, the non-linear profile generator 2200 may be a Hershey-Kiss profile generator. The phase locked loop 2100 may include a phase frequency detector 2110, a charge pump 2120, a loop filter 2130, a voltage controlled oscillator 2140, a divider 2150, and an OR gate 2160. According to some example embodiments of the inventive concepts, a method in which a frequency-to-time graph of the output signal CLK_out takes a non-linear waveform profile by adjusting a signal 2210 inputted to the charge pump 2120 will be described.

Figure 9:
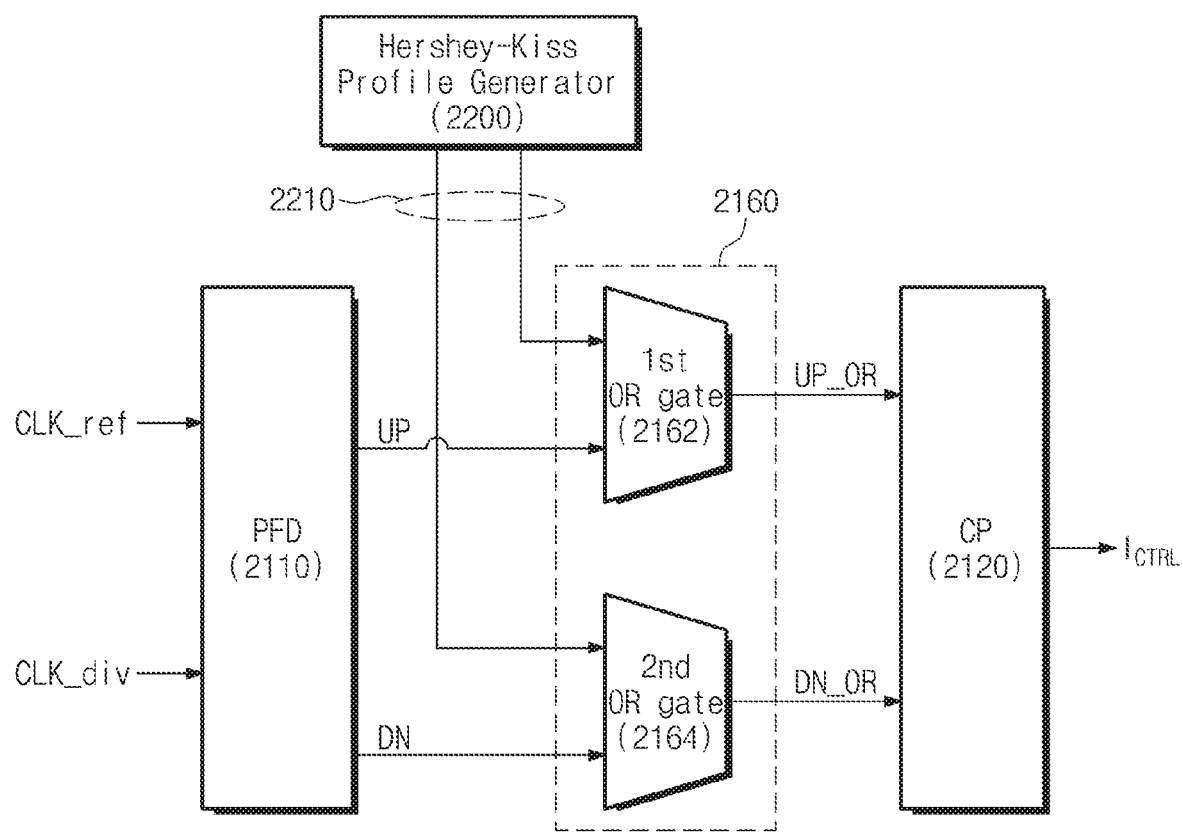
FIG. 9 is a block diagram illustrating a portion of a non-linear profile generator illustrated in FIG. 8.

FIG. 9 is a block diagram illustrating a portion of a non-linear profile generator 2000 illustrated in FIG. 8. According to some example embodiments of the inventive concepts, after the phase locked loop 2100 is locked (i.e., after the output signal CLK_out is stabilized), step pulses 2210 which the non-linear profile generator 2200 respectively generates may be generated. However, the step pulses 2210 may be generated even before the phase locked loop 2100 is locked.

The phase frequency detector 2110 may receive the reference signal CLK_ref and the feedback signal CLK_div, may compare a frequency of the reference signal CLK_ref with a frequency of the feedback signal CLK_div, and compare a phase of the reference signal CLK_ref with a phase of the feedback signal CLK_div. When a phase of the reference signal CLK_ref leads a phase of the feedback signal CLK_div, the phase frequency detector 2110 may output an up signal UP of logic 1, and a down signal DN of logic 0. On the other hand, when a phase of the reference signal CLK_ref lags behind a phase of the feedback signal CLK_div, the phase frequency detector 2110 may output the up signal UP of logic 0, and the down signal DN of logic 1.

When the phase locked loop 2100 is locked, the phase locked loop 2110 may output the up signal UP and the down signal DN which are outputted at the same time and each of which is composed of short-pulses of which the pulse widths are very short. If and/or when there is no or substantially no phase difference between the reference signal CLK_ref and the feedback signal CLK_div, the phase locked loop 2100 may be locked, and thus the output signal CLK_out may be stabilized. At this time, a pulse of which a width is very short may be outputted at a rising edge interval.

The OR gate 2160 may include the first OR gate 2162 and a second OR gate 2164. The first OR gate 2162 may execute an OR operation with respect to the up signal UP and the output signal 2210 from the non-linear profile generator 2200 and may output a result UP_OR. A value of a signal, which has a high level, from among the up signal UP and the output signal (e.g., one of the step pulses) 2210 of the non-linear profile generator 2200 may be outputted according to the result of the OR operation. When the phase locked loop 2100 is locked, a value of a signal, which has a high level, from among the step pulses 2210 of the non-linear profile generator 2200 may be outputted.

Moreover, the second OR gate 2164 may execute an OR operation with respect to the down signal DN and the output signal (e.g., the step pulses) 2210 from the non-linear profile generator 2200 and may output a result DN_OR Likewise, a value of a signal, which has a high level, from among the down signal DN and the output signal 2210 of the non-linear profile generator 2200 may be outputted according to the result of the OR operation. The first OR gate 2162 may be substantially equal to the second OR gate 2164 except that the second OR gate 2164 receives not the up signal UP but the down signal DN.

The charge pump 2120 may operate under control of output signals UP_OR and DN_OR of the OR gate 2160 and may generate the control current ICTRL. The charge pump 2120 may convert the output signal 2210 of the non-linear profile generator 2200 into a current.

Figure 10:
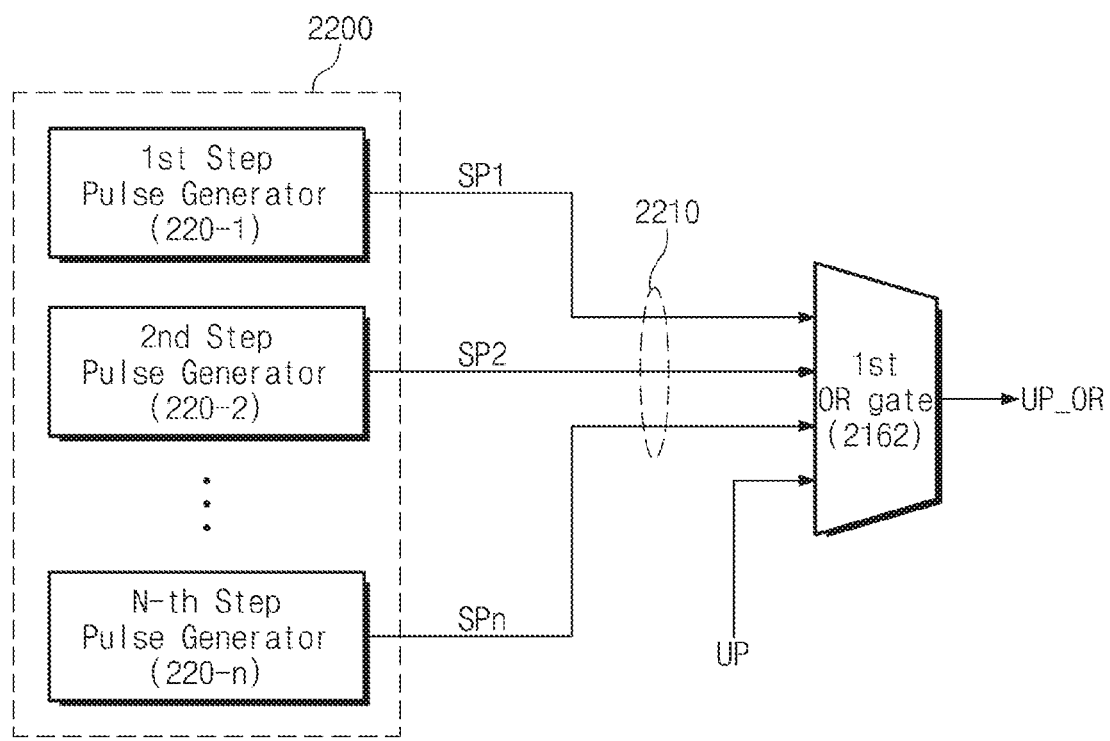
FIG. 10 is a block diagram illustrating a non-linear profile generator and a first OR gate illustrated in FIG. 9.
Figure 11:
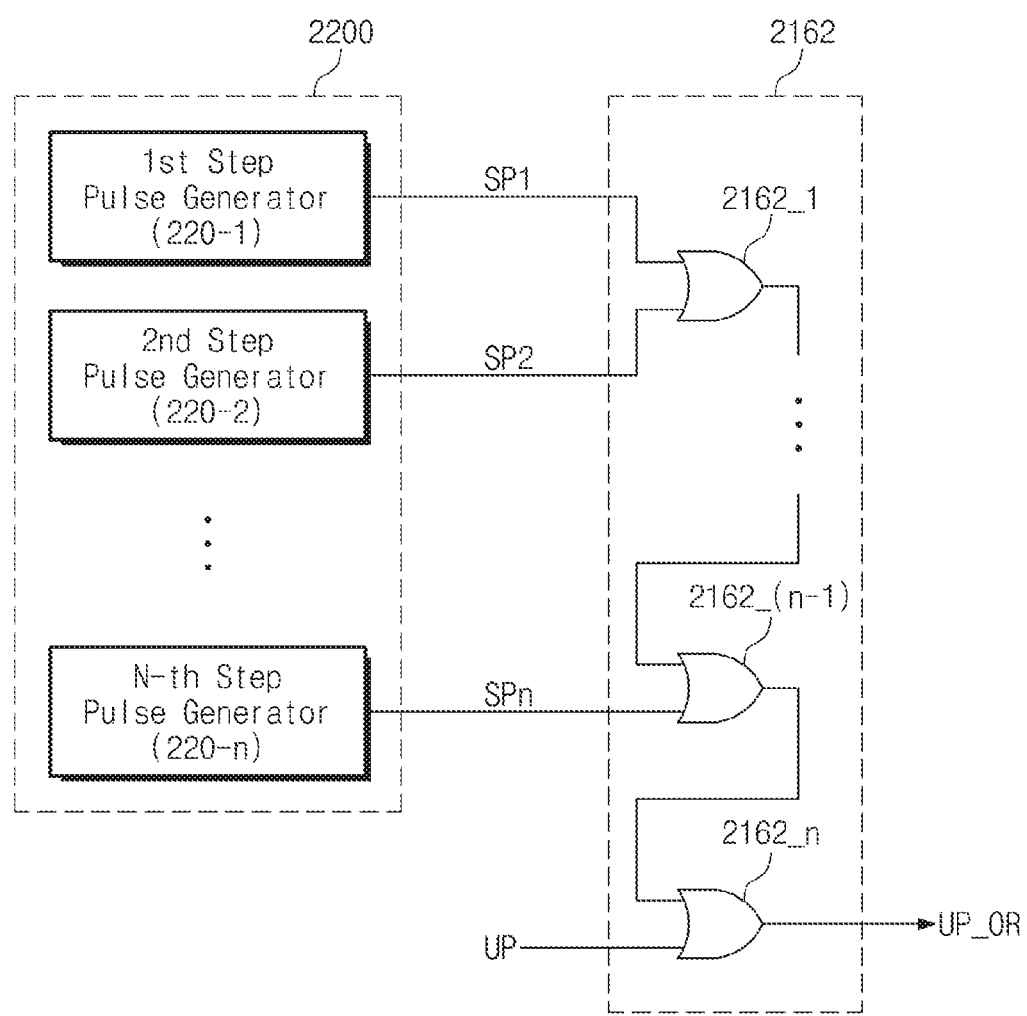
FIG. 11 is a block diagram illustrating a first OR gate illustrated in FIG. 10.

FIG. 10 is a block diagram illustrating a non-linear profile generator 2200 and a first OR gate 2162 illustrated in FIG. 9. FIG. 11 is a block diagram illustrating a first OR gate 2162 illustrated in FIG. 10.

The non-linear profile generator 2200 may include a plurality of step pulse generators 220-1 to 220-$n$. Each of step pulse generators 220-1 to 220-$n$ may generate each of step pulses SP1 to SPn. The first OR gate 2162 may receive the step pulses SP1 to SPn and the up signal UP and may execute an OR operation with respect to the step pulses SP1 to SPn and the up signal UP.

A configuration of the first OR gate 2162 according to some example embodiments is illustrated in FIG. 11. The first OR gate 2162 may include a plurality of OR gates 2162_1 to 2162_(n−1) receiving the step pulses SP1 to SPn and an OR gate 2162_$n$ receiving the up signal UP. The signal UP_OR may be outputted according to the result of the OR operation by the first OR gate 2162. A structure of the first OR gate 2162 is an example. However, the scope and spirit of the inventive concepts may not be limited thereto. For example, the first OR gate 2162 may be implemented with various configurations each of which selectively outputs a value of a signal, which has a high level, from among the step pulses SP1 to SPn and the up signal UP.

Figure 12:
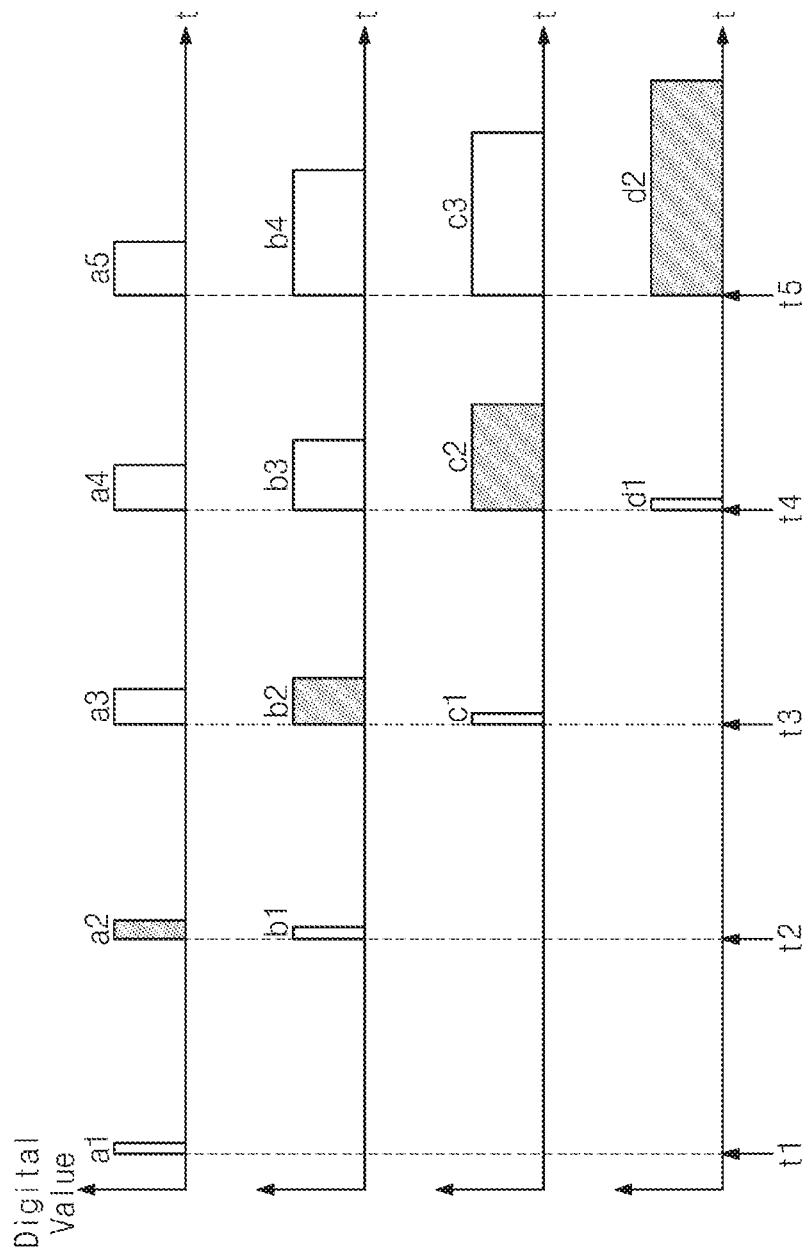
FIG. 12 is a timing diagram illustrating waveforms of step pulses according to some example embodiments of the inventive concepts.

FIG. 12 is a timing diagram illustrating waveforms of step pulses SP1 to SPn. For descriptive simplification, the non-linear profile generator 2200 may include four step pulse generators. It is assumed that the first OR gate 2162 includes three OR gates and one OR gate receiving the up signal UP. Pulses a1 to a5 which are placed at the top line may correspond to the first step pulses SP1, and afterwards, the second to fourth step pulses SP2 to SP4 may be sequentially illustrated.

The pulse width of each of the first step pulses generated by the first step pulse generator 220-1 may have an increment of Δa. That is, a difference between the pulse widths of two pluses, which are adjacent to each other, from among the first step pulses may be Δa. Likewise, the pulse widths of two pluses, which are adjacent to each other, from among the second step pulses generated by the second step pulse generator 220-2 may have a difference of Δb. The pulse widths of two pluses, which are adjacent to each other, from among the third step pulses generated by the third step pulse generator 220-3 may have a difference of Δc. The pulse widths of two pluses, which are adjacent to each other, from among the fourth step pulses generated by the fourth step pulse generator 220-4 may have a difference of Δd. Here, Δa<Δb<Δc<Δd.

Compared with the first step pulses, the second step pulse generator 2202 may output the second step pulses which are delayed by one period of a pulse. Compared with the second step pulses, the third step pulse generator 220-3 may output the third step pulses which are delayed by one period of a pulse. Compared with the third step pulses, the fourth step pulse generator 220-4 may output the fourth step pulses which are delayed by one period of a pulse.

However, the second pulse generated by each step pulse generator may have a width, which is the widest, from among widths of pulses generated at the same timing. For example, the second pulse a2 generated by the first step pulse generator 220-1 may have the widest pulse width among the pulse widths of pulses (i.e., a2 and b1) generated at the same timing. Similarly, the second pulse d2 generated by the fourth step pulse generator 220-4 may have the widest pulse width among pulse widths of pulses (i.e., a5, b4, c3, and d2) generated at the same timing. This is illustrated in FIG. 12 as being shaped.

Figure 13:
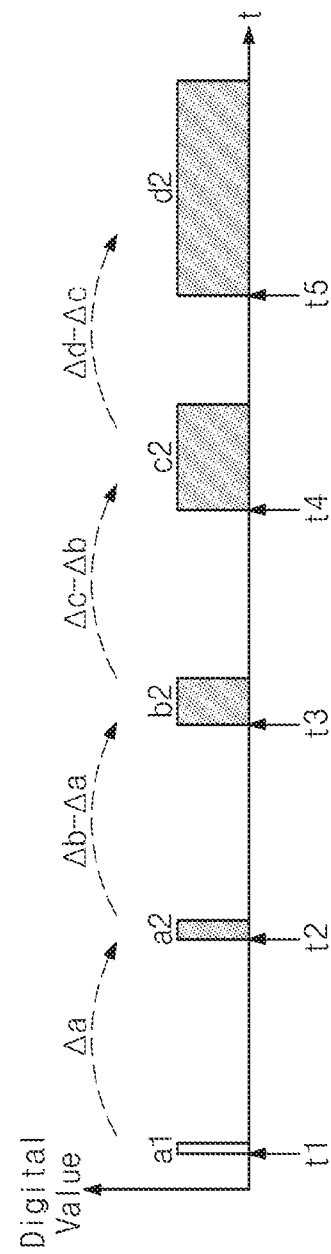
FIG. 13 is a timing diagram illustrating a waveform of a result in which an OR operation is executed with respect to an output signal of a non-linear profile generator according to some example embodiments of the inventive concepts.

FIG. 13 is a timing diagram illustrating a waveform of a result UP_OR in which an OR operation is executed with respect to an output signal 2210 of a non-linear profile generator 2000. When an OR operation is executed with respect to the first to fourth step pulses SP1 to SP4, a pulse of which the pulse width is the widest may be outputted. As a result, the pulses a1, a2, b2, c2, and d2 of which pulse widths non-linearly increase may be outputted. In more detail, the pulse width of the pulse a2 may be wider than the pulse width of the pulse a1 by Δa. The pulse width of the pulse b2 may be wider than the pulse width of the pulse a2 by Δb–Δa. The pulse width of the pulse c2 may be wider than the pulse width of the pulse b2 by Δc–Δb. Lastly, the pulse width of the pulse d2 may be wider than the pulse width of the pulse c2 by Δd–Δc.

As such, voltage pulses of which pulse widths non-linearly increase may pass through the charge pump 2120, the loop filter 2130, and the voltage controlled oscillator 2140 and may be used to generate a frequency-to-time graph taking a non-linear waveform profile. The non-linear waveform profile may be a Hershey-Kiss profile.

Figure 14A:
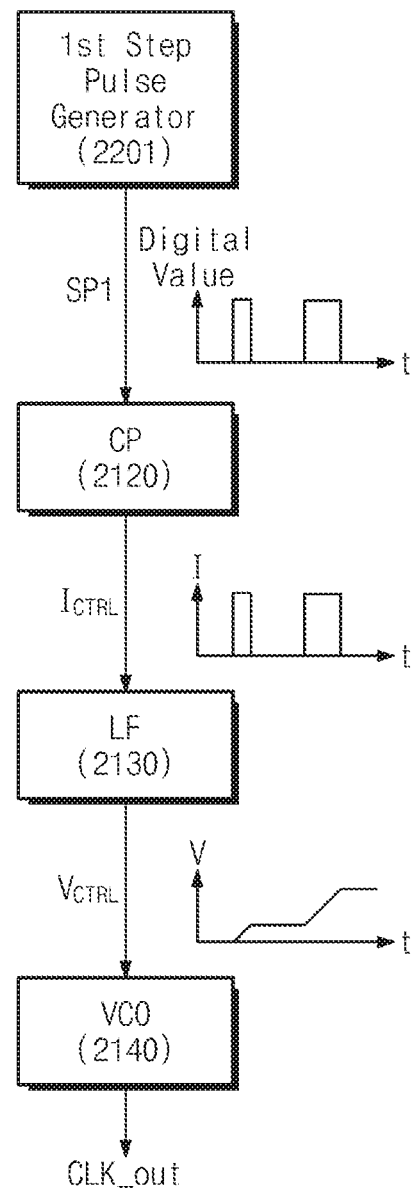
FIG. 14A and FIG. 14B is block diagrams for describing a procedure in which voltage pulses generated by a step pulse generator are transformed by passing through a phase locked loop according to some example embodiments of the inventive concepts.
Figure 14B:
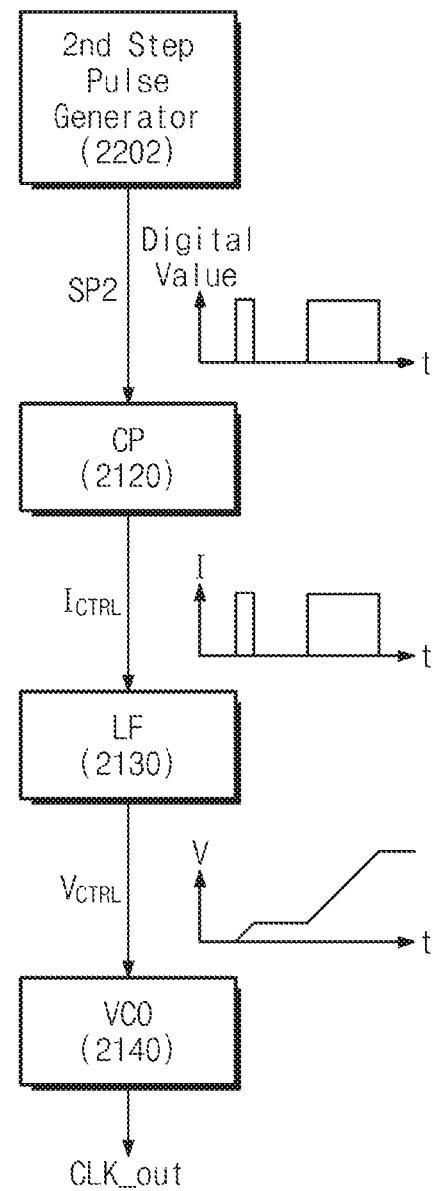

FIG. 14A and FIG. 14B are block diagrams for describing a procedure in which voltage pulses generated by a step pulse generator are transformed by passing through a phase locked loop.

FIG. 14A illustrates a transformation procedure about first step pulses generated by the first step pulse generator 2201, and FIG. 14B illustrates a transformation procedure about second step pulses generated by the second step pulse generator 2202. To show a difference between a processing procedure about the first step pulses and a processing procedure about the second step pulses, an operating procedure by an OR gate may be omitted.

Referring to FIG. 14A which shows the transformation of the first step pulses, the first step pulses SP1 generated by the first step pulse generator 2201 may be transformed into the control current ICTRL through the charge pump 2120. At this time, a pulse width after the transformation may be maintained to be the same as that before the transformation.

As illustrated in FIGS. 14A-B, the control current ICTRL may be transformed into a step waveform by pass through the loop filter 21. The loop filter 2130 may operate as an integrator as well as a low pass filter which removes a high-frequency component. Referring to an output waveform of the loop filter 2130, a voltage level may increase with a positive slope at an interval corresponding to an interval in which a level of the control current ICTRL is logic 1, but a slope may be '0' at an interval corresponding to an interval in which a level of the control current ICTRL is logic 0. As illustrated in FIGS. 14A-B, a waveform (i.e., control voltage VCTRL) may be schematically formed.

Meanwhile, because a change of the pulse width of each of the second step pulses SP2 is greater than a change of the pulse width of each of the first step pulses SP1, as illustrated in FIGS. 14A-B, a waveform (i.e., control voltage VCTRL) of which the voltage increase is great may be formed. Even though output results of the first step pulses SP1 and the second step pulses SP2 are illustrated in FIGS. 14A-B, if an OR operation is executed with respect to many voltage pulses, the output result (i.e., control voltage VCTRL) may schematically take a non-linear waveform profile. The non-linear waveform profile may be a Hershey-Kiss profile.

Figure 15:
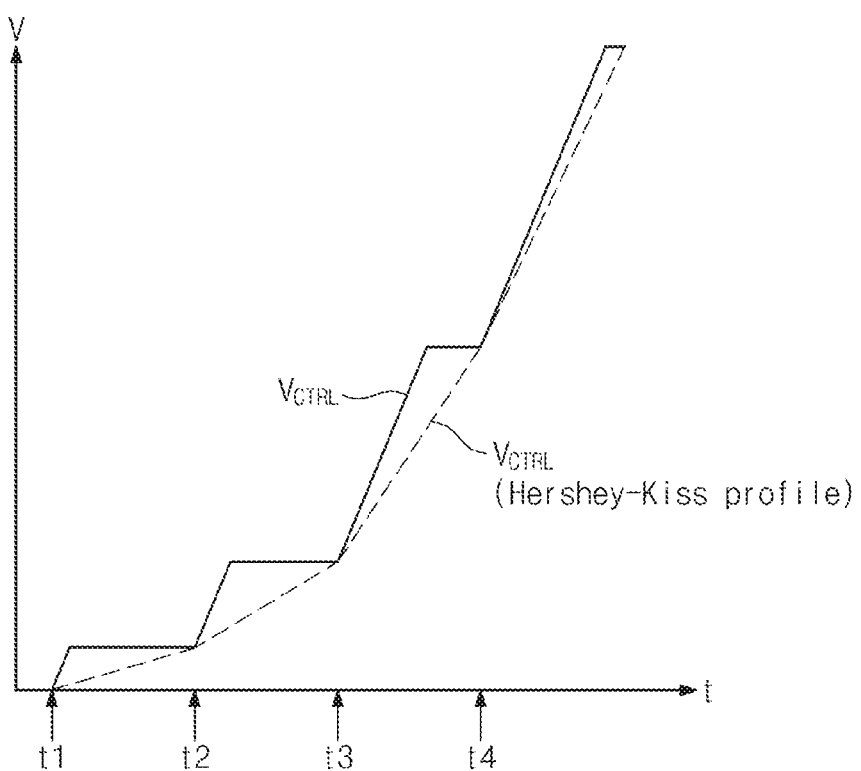
FIG. 15 is a flowchart illustrating an output waveform of a control voltage, according to some example embodiments of the inventive concepts.

FIG. 15 is a flowchart illustrating an output waveform of a control voltage VCTRL, according to some example embodiments of the inventive concepts. An embodiment of the inventive concepts is exemplified in FIG. 15 as step pulses generated by the step pulse generators 2201 to 2204 are processed through the OR gate 2160, the charge pump 2120, and the loop filter 2130, and the processed output result. That is, FIG. 15 schematically illustrates a waveform when pulses illustrated in FIG. 13 pass through the OR gate 2160, the charge pump 2120, and the loop filter 2130.

A solid line may denote a real waveform of the control voltage VCTRL which is an output of the loop filter 2130. Moreover, a dotted line may denote a line connecting edges of the control voltage VCTRL. Because only four step pulse generators are used, a voltage waveform taking a non-linear waveform profile which is relatively rough ("approximated") may be outputted. However, if the number of step pulse generators increases, a voltage waveform taking the non-linear waveform profile which is relatively smooth may be outputted. A waveform having the form may pass through the voltage controlled oscillator 2140 and may be outputted. Accordingly, a frequency-to-time graph which is the same form as a graph illustrated in FIG. 15 may be obtained.

The graph illustrated in FIG. 15 may correspond to interval A of FIG. 3. The control voltages VCTRL corresponding to each of intervals B, C, and D may be generated using the above-described method which is properly changed. For example, the control voltages VCTRL having a slope of a negative voltage may be generated by reducing pulse widths of pulses generated by each of the step pulse generators. Moreover, the control voltage VCTRL having a negative value may be generated using an inverter such that pulses generated by each of the step pulse generators have a negative value.

According to some example embodiments of the inventive concepts, the output signal CLK_out taking a non-linear Hershey-Kiss profile may be generated by linearly combining a plurality of pulses generated by each of a plurality of step pulse generators. As described above, because the non-linear Hershey-Kiss profile may be generated using a linear combination, not directly generating the non-linear Hershey-Kiss profile, a configuration of a circuit may be simplified, thereby making it possible to reduce a chip area. Moreover, because there is not a need of a complex operation, an operating speed may be improved.

Figure 16:
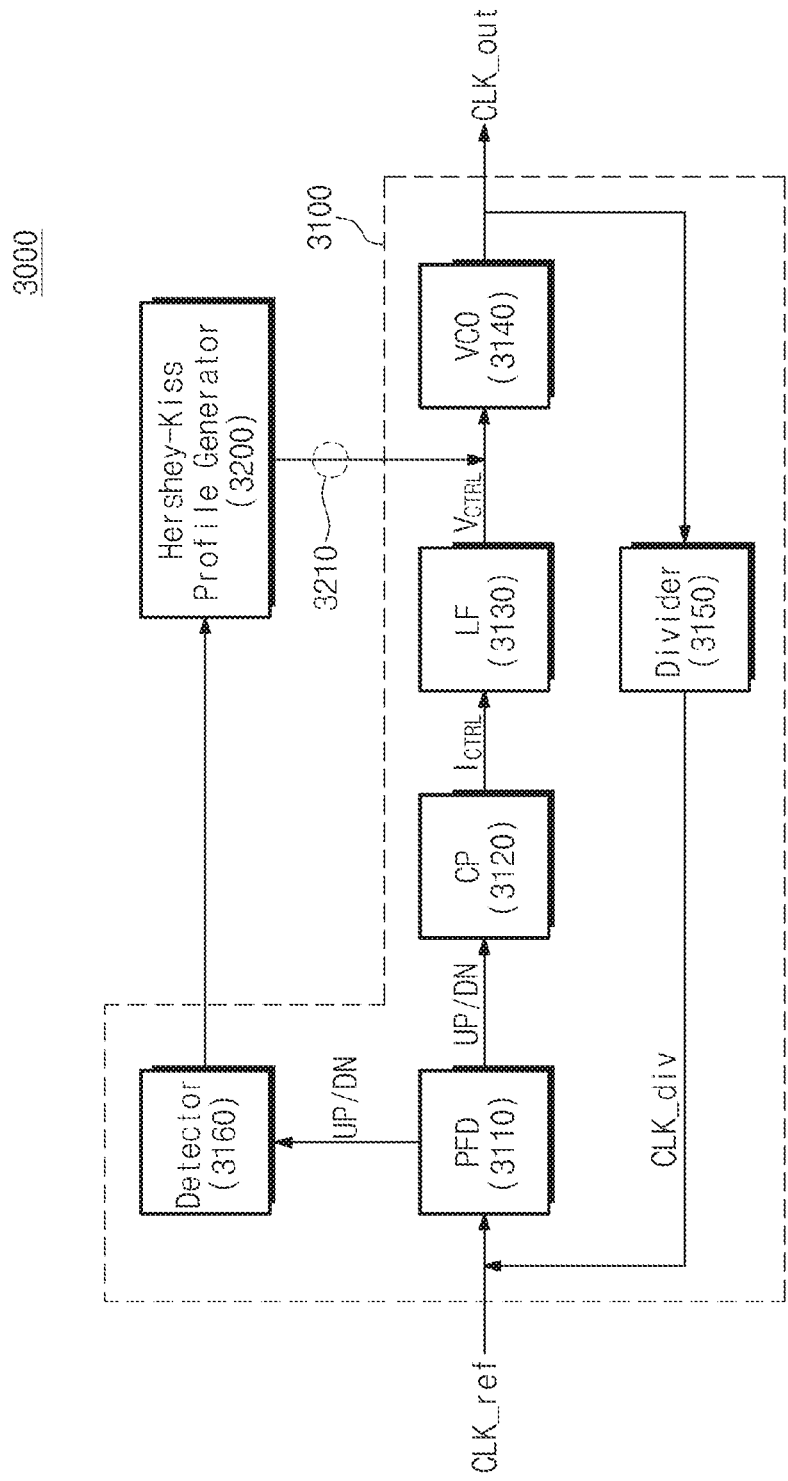
FIG. 16 is a block diagram illustrating a spread spectrum clock generator according to some example embodiments of the inventive concepts.

FIG. 16 is a block diagram illustrating a spread spectrum clock generator 3000 according to some example embodiments of the inventive concepts. An embodiment of the inventive concepts is exemplified as a frequency-to-time graph of the output signal CLK_out takes a non-linear waveform profile by directly generating the control voltage VCTRL taking the non-linear waveform profile and inputting the generated control voltage VCTRL to the voltage controlled oscillator 2140. The non-linear waveform profile may be a Hershey-Kiss profile.

A spread spectrum clock generator 3000 may include a phase locked loop 3100 and a non-linear waveform profile generator 3200. The non-linear waveform profile generator 3200 may be a Hershey-Kiss profile generator 3200, as shown in FIG. 16. The phase locked loop 3100 may include a phase frequency detector 3110, a charge pump 3120, a loop filter 3130, a voltage controlled oscillator 3140, a divider 3150, and a detector 3160. A description duplicated with a description given with reference to the above-described embodiment may be omitted.

However, according to some example embodiments of the inventive concepts, the phase locked loop 3100 may further include the detector 3160 which detects whether the phase locked loop 3100 is locked. The detector 3160 may detect whether the phase locked loop 3100 is locked, and thus the non-linear profile generator 3200 generates an output signal 3210.

Figure 17:
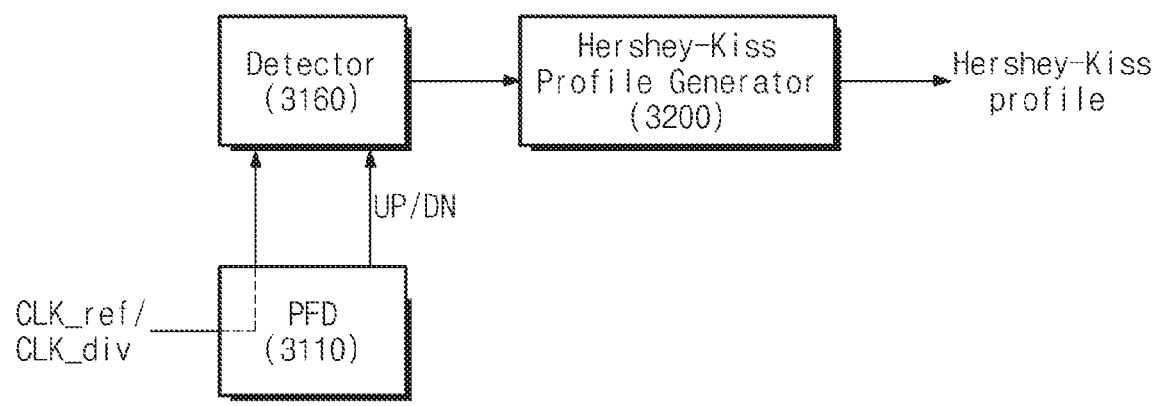
FIG. 17 is a block diagram illustrating a portion of a non-linear clock generator illustrated in FIG. 16.

FIG. 17 is a block diagram illustrating a portion of a non-linear clock generator 3000 illustrated in FIG. 16. The detector 3160 may receive the reference signal CLK_ref and the feedback signal CLK_div. Even though it is illustrated as the detector 3160 receives the reference signal CLK_ref and the feedback signal CLK_div through the phase frequency detector 3110, the detector 3160 may directly receive the reference signal CLK_ref and the feedback signal CLK_div without passing through the phase frequency detector 3110. Moreover, the detector 3160 may receive the up signal UP and the down signal DN from the phase frequency detector 3110.

The detector 3160 may determine whether the phase locked loop 3100 is locked, using the four received signals (i.e., the reference signal CLK_ref, the feedback signal CLK_div, the up signal UP, and the down signal DN). For example, when there is no phase difference between the reference signal CLK_ref and the feedback signal CLK_div and there is no phase difference between the up signal UP and the down signal DN, this may mean that the phase locked loop 3100 is locked. At this time, the detector 3160 may control the non-linear profile generator 3200 so as to generate an output voltage taking a non-linear waveform profile.

Figure 18:
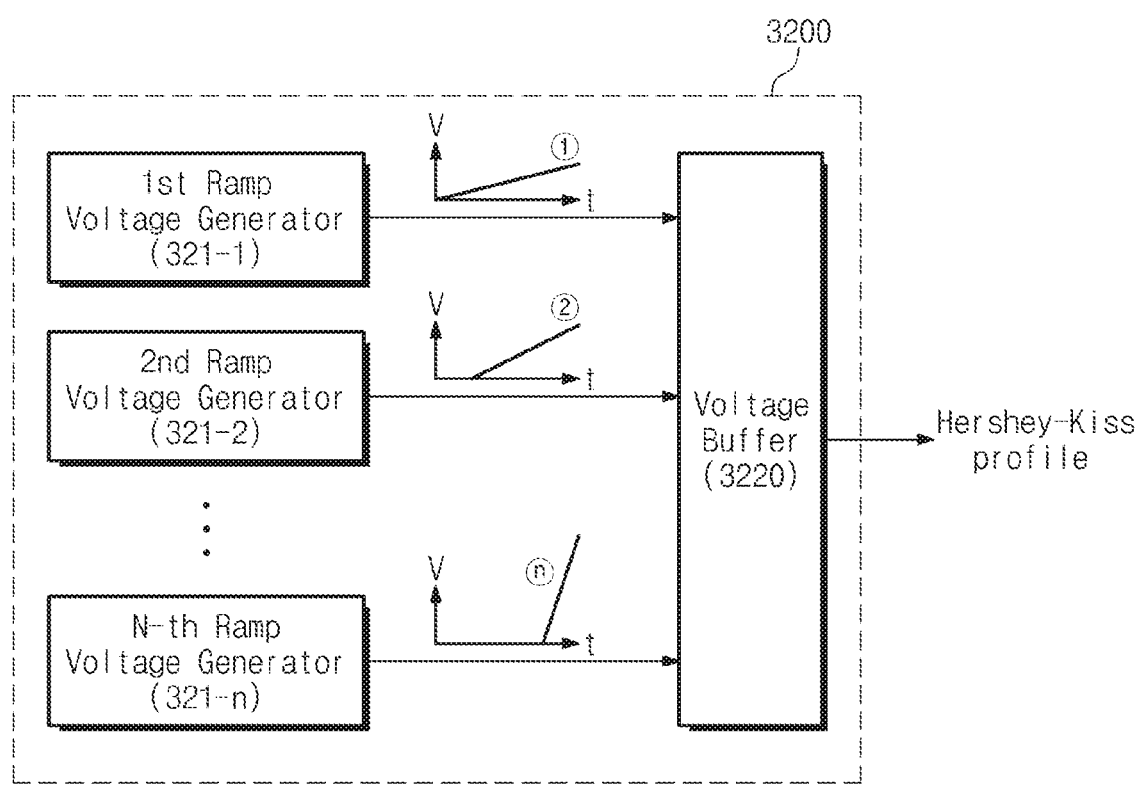
FIG. 18 is a block diagram illustrating a non-linear profile generator illustrated in FIG. 16.

FIG. 18 is a block diagram illustrating a non-linear profile generator 3200 illustrated in FIG. 16.

Referring to FIG. 18, the non-linear profile generator 3200 may include a plurality of ramp function generators 321-1 to 321-n, and a voltage buffer 3220. The first ramp voltage generator 321-1 may generate a first linear ramp voltage ①, of which a voltage slope is the smallest, from among a plurality of linear ramp voltages. As first ramp voltage generator 321-1 generates the first linear ramp voltage ①, the second ramp voltage generator 321-2 may generate a second linear ramp voltage ② of which the voltage slope (rate of change of magnitude of the linear ramp voltage over time) is greater than the voltage slope of the first linear ramp voltage ①. However, a point in time of generation ("initiation time value") of the second linear ramp voltage ② lags behind a point in time of generation of the first linear ramp voltage ①. Lastly, the n-th ramp voltage generator 321-n may generate an n-th linear ramp voltage ⓝ, of which the voltage slope is the greatest, among a plurality of linear ramp voltages. However, a point in time of generation of the n-th linear ramp voltage ⓝ may be the latest.

The voltage buffer 3220 may receive a plurality of linear ramp voltages and may selectively output a voltage having a magnitude that is the greatest of the magnitudes of the linear ramp voltages outputted by the generators 321-1 to 321-n.

Figure 19:
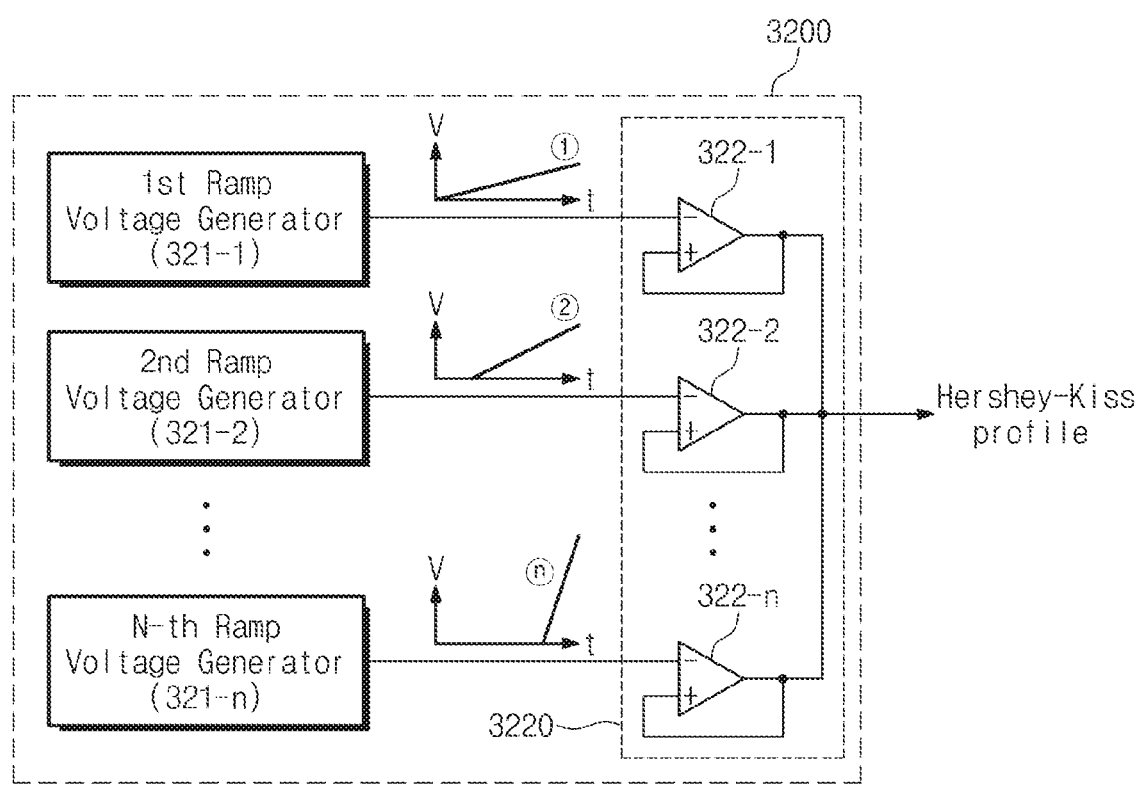
FIG. 19 is a block diagram illustrating a non-linear profile generator illustrated in FIG. 18.

FIG. 19 is a block diagram illustrating a non-linear profile generator 3200 illustrated in FIG. 18. The voltage buffer 3220 may include a plurality of voltage followers 322-1 to 322-n respectively connected to a plurality of ramp voltage generators 321-1 to 321-n. Each of the voltage followers may maintain a level of a voltage received from the corresponding ramp voltage generator. As a result, a voltage, of which the absolute value is the greatest, from among a plurality of linear ramp voltages may be selectively outputted. An embodiment of the inventive concepts is exemplified as the voltage followers 322-1 to 322-n are used as an embodiment of the voltage buffer 3220 illustrated in FIG. 18. However, the scope and spirit of the inventive concepts may not be limited thereto. For example, the voltage buffer 3220 may be implemented with various configurations each of which maintains a constant level of a voltage inputted from each of the ramp voltage generators and may selectively output the voltage.

Figure 20:
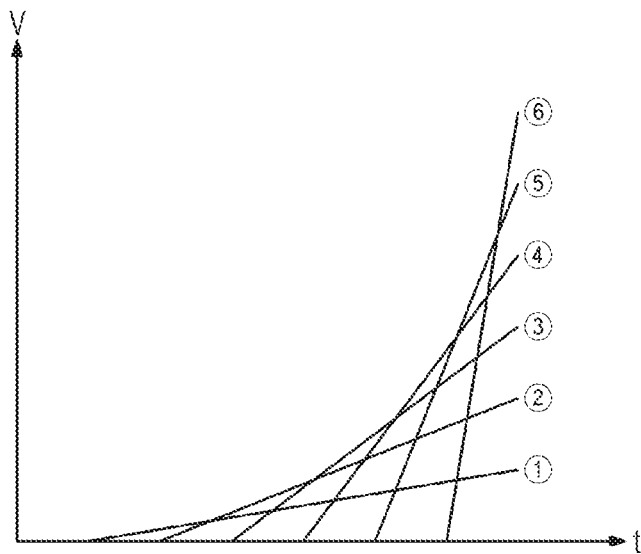
FIG. 20 is a block diagram illustrating an output voltage of a non-linear profile generator illustrated in FIG. 18 or 19.

FIG. 20 is a block diagram illustrating an output voltage of a non-linear profile generator 3200 illustrated in FIG. 18 or 19. It is assumed that six ramp voltage generators are used. For two linear ramp voltages (e.g., a linear ramp voltage ② and a linear ramp voltage ③) generated at an interval (e.g., from a point in time of generation of the linear ramp voltage ② to a point in time of generation of the linear ramp voltage ③), a rate of change of the linear ramp voltage ② generated earlier than the linear ramp voltage ③ may be smaller than a rate of change of the linear ramp voltage ③.

The graph illustrated in FIG. 20 may correspond to interval A illustrated in FIG. 3. A voltage, which corresponds to each of the remaining intervals B, C, and D, taking a non-linear waveform profile may be generated by controlling the ramp voltage generators such that a linear ramp voltage which each of the ramp voltage generators generates has a negative voltage rate of change or controlling the ramp voltage generators such that the linear ramp voltage has a negative voltage level. The non-linear waveform profile may be a Hershey-Kiss profile. A voltage taking the non-linear waveform profile may pass through the voltage controlled oscillator 3140, and finally, the output signal CLK_out taking the non-linear waveform profile may be generated.

According to some example embodiments of the inventive concepts, an output signal taking a non-linear waveform profile may be obtained using a combination of linear ramp voltages. Because the non-linear waveform profile may be generated using a linear combination, not directly generating the non-linear waveform profile, a configuration of a circuit may be simplified, thereby making it possible to reduce a chip area. Moreover, an operating speed of a spread spectrum clock generator may be improved.

Figure 21:
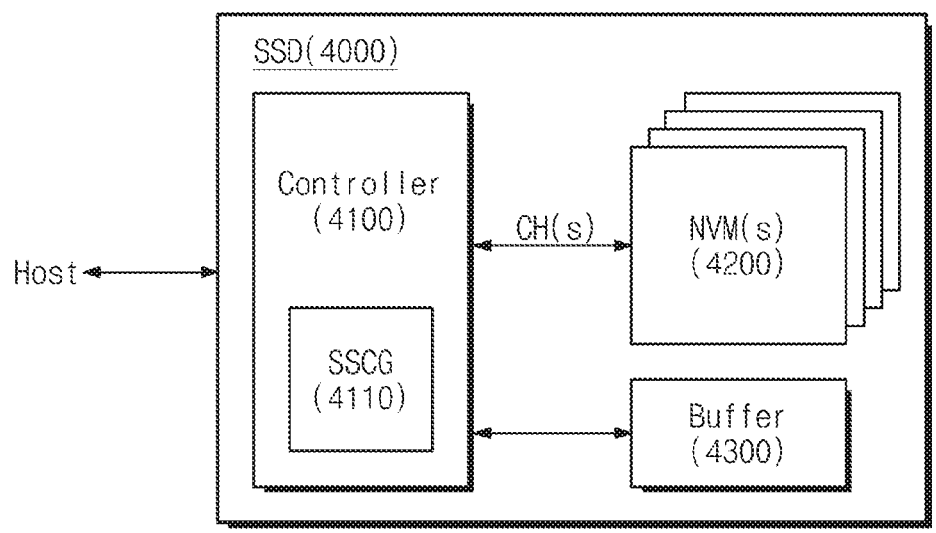
FIG. 21 is a block diagram illustrating a solid state drive (SSD) according to some example embodiments of the inventive concepts.

FIG. 21 is a block diagram illustrating a solid state drive (SSD) 4000 according to some example embodiments of the inventive concepts. Referring to FIG. 21, an SSD 4000 may include a controller 4100 having a spread spectrum clock generator 4110 according to some example embodiments of the inventive concepts. Moreover, the SSD 4000 may include a plurality of nonvolatile memories 4200 and the buffer 4300.

The controller 4100 may provide a physical connection between a host and the SSD 4000. That is, the controller 4100 may interface with the SSD 4000 in compliance with the bus format of the host. Especially, the controller 4100 may decode a command provided from the host. The controller 4100 may access the nonvolatile memories 4200 based on the decoded result. The bus format of the host may include a universal serial bus (USB), a small computer system interface (SCSI), a peripheral component interconnect (PCI) express, an advanced technology attachment (ATA), a parallel ATA (PTA), a serial ATA (SATA), or a serial attached SCSI (SAS).

The controller 4100 may include the spread spectrum clock generator 4110 according to some example embodiments of the inventive concepts. The spread spectrum clock generator 4110 may generate clock signals ("clocks"), which take ("have") a non-linear waveform profile, of which the frequency is non-linearly changed, using a plurality of linear combinations. The clocks generated by the spread spectrum clock generator 4110 may be used to interface with the host or the nonvolatile memories 4200. As a result, an EMI phenomenon may be reduced, thereby making it possible to improve reliability of the SSD 4000.

The nonvolatile memories 4200 may be provided as storage medium of the SSD 4000. For example, the nonvolatile memories 4200 may be provided as a NAND-type flash memory having a high storage capacity. The nonvolatile memories 4200 may include a plurality of memory devices. At this case, each of the memory devices may be connected to the controller 4100 by a channel. An embodiment of the inventive concepts is exemplified as the nonvolatile memories 4200 are implemented with an NAND flash memory as storage medium. However, the scope and spirit of the inventive concepts may not be limited thereto. For example, the nonvolatile memories 4200 may be implemented with other nonvolatile memory devices. That is, the storage medium of the nonvolatile memories 4200 may be implemented with a phase-change random access memory (PRAM), a magneto-resistive RAM (MRAM), a resistive RAM (ReRAM), and a ferroelectric RAM (FRAM), a NOR flash memory, and the like, and a memory system including different types of memory devices may be used as the storage medium of the nonvolatile memories 4200.

Write data provided from the host or data read from the nonvolatile memories 4200 may be temporarily stored in the buffer 4300. The buffer 4300 may be a synchronous dynamic random access memory (SDRAM) for providing a sufficient buffering to the SSD 4000 used as an auxiliary memory device of a high-capacity. However, it is apparent to those skilled in the art that the buffer 4300 is not limited thereto.

Figure 22:
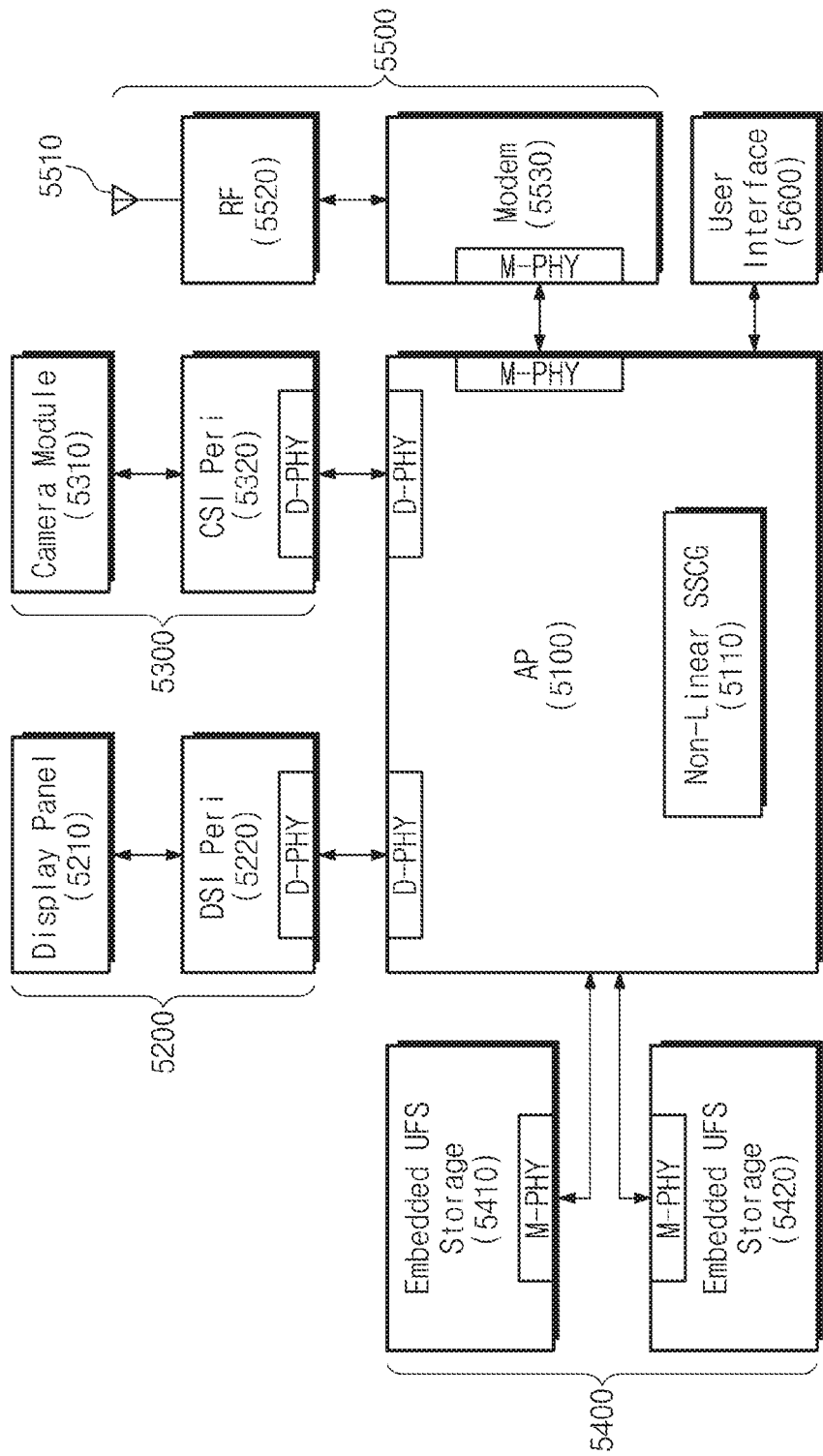
FIG. 22 is a block diagram illustrating a mobile device 3000 to which the inventive concepts is applied.

FIG. 22 is a block diagram illustrating a mobile device 3000 to which the inventive concepts is applied. Referring to FIG. 22, a mobile device 5000 may be configured to support a mobile industry processor interface (MIPI) standard or an embedded DisplayPort (eDP) standard. The mobile device 5000 may include an application processor 5100, a display unit 5200, an image processing unit 5300, data storage 5400, a wireless transceiver unit 5500, and a user interface 5600.

The application processor 5100 may control an overall operation of the mobile device 5000. The application processor 5100 may include a spread spectrum clock generator 5110 according to some example embodiments of the inventive concepts. The spread spectrum clock generator 5110 may generate clocks, which take a non-linear waveform profile, of which the frequency is non-linearly changed, using a plurality of linear combinations. The clocks generated by the spread spectrum clock generator 5110 may be variously used at the mobile device 5000. For example, the clocks generated by the spread spectrum clock generator 5110 may be used for an operation at the application processor 5100. The clocks generated by the spread spectrum clock generator 5110 may be used to interface with the data storage 5400. The clocks generated by the spread spectrum clock generator 5110 may be used to drive the display panel 5210.

The display unit 5200 may include the display panel 5210 and a display serial interface (DSI) peripheral circuit 5220. The display panel 5210 may display image data. A DSI host mounted on the application processor 5100 may perform a serial communication with the display panel 5210 through a DSI. The DSI peripheral circuit 5220 may include a timing controller, a data driver, and the like which are required to drive the display panel 5210.

The image processing unit 5300 may include a camera module 5310 and a camera serial interface (CSI) peripheral circuit 5320. The image processing unit 5300 may include a lens, an image sensor, an image processor, and the like. Image data generated from the camera module 5310 may be processed by the image processor, and the processed image may be transmitted to the application processor 5100 through a CSI.

The data storage 5400 may include embedded universal flash storage (UFS) storage 5410 and a removable UFS card 5420. The embedded UFS storage 5410 and the removable UFS card 5420 may communicate with the application processor 5100 through an M-PHY layer. Meanwhile, a host (i.e., application processor 5100) may include a bridge so as to communicate with the removable UFS card 5420 based on another protocol different from a UFS protocol. The application processor 5100 and the removable UFS card 5420 may communicate with each other based on various card protocols (e.g., a universal serial bus (USB) flash drive (UFD), a multimedia card (MMC), an embedded multimedia card (eMMC), a secure digital (SD), a mini SD, a Micro SD, and the like). The embedded UFS storage 5410 and the removable UFS card 5420 may be implemented with a three-dimensional nonvolatile memory device in which a cell string of memory cells is formed to be perpendicular to a substrate.

A wireless transceiver unit 5500 may include an antenna 5510, a radio frequency (RF) unit 5520, and a modulator/demodulator (modem) 5530. An embodiment of the inventive concepts is exemplified as the modem 5530 communicates with the application processor 5100 through an M-PHY layer. However, the scope and spirit of the inventive concepts may not be limited thereto. For example, the modem 5530 may be included in the application processor 5100.

The spread spectrum clock generator according to some example embodiments of the inventive concepts may generate clocks, of which the frequency is non-linearly changed and which take a non-linear waveform profile, using a plurality of linear combinations.

Those of ordinary skill in the art will recognize that various changes and modifications of the embodiments described herein can be made without departing from the scope and spirit of the example embodiments. If modifications of the present example embodiments are included within the scope of the following claims and equivalents, the example embodiments is considered to include the modifications and variations of this example embodiments.

What is claimed is:

1. An apparatus comprising:
a non-linear profile generator configured to,
generate a first plurality of pulses, respective durations of the first plurality of pulses being increased by a first increment, and
generate a second plurality of pulses, respective durations of the second plurality of pulses being increased by a second increment; and
a phase locked loop including an OR gating circuit configured to perform a first OR operation on an up signal, the first plurality of pulses and the second plurality of pulses, and to perform a second OR operation on a down signal, the first plurality of pulses and the second plurality of pulses, the phase locked loop configured to,
  detect a phase difference between a reference signal and a feedback signal,
  generate a control current based on the first plurality of pulses, the second plurality of pulses, and the detected phase difference,
  generate a control voltage based on the control current, and
  generate an output signal based on the control voltage.

2. The apparatus of claim 1, wherein the first increment and the second increment are additive increments.

3. The apparatus of claim 1, wherein a period of the first plurality of pulses and a period of the second plurality of pulses are identical to each other.

4. The apparatus of claim 3, wherein the second plurality of pulses are generated the period later than the first plurality of pulses.

5. The apparatus of claim 4, wherein the first increment is less than the second increment.

6. The apparatus of claim 1, wherein a level of the control voltage is increased at an interval corresponding to an interval in which a level of the control current is logic high.

7. The apparatus of claim 6, wherein a level of the control voltage is maintained at an interval corresponding to an interval in which a level of the control current is zero.

8. The apparatus of claim 1, wherein the phase locked loop comprises:
  a phase detector configured to detect the phase difference between the reference signal and the feedback signal and generate the up signal and the down signal based on the detected phase difference, wherein the OR gating circuit is configured to perform the first OR operation on the first plurality of pulses, the second plurality of pulses, and the up signal, and to perform the second OR operation on the first plurality of pulses, the second plurality of pulses, and the down signal;
  a charge pump configured to generate the control current based on results of the first OR operation and the second OR operation;
  a loop filter configured to output the control voltage based on the control current; and
  a voltage controlled oscillator configured to generate the output signal based on the control voltage.

9. The apparatus of claim 8, wherein the phase locked loop further comprises:
  a divider configured to generate the feedback signal based on dividing the output signal by a divisional ratio.

10. The apparatus of claim 8, wherein the OR gating circuit comprises:
  a first OR gate configured to perform the first OR operation on the first plurality of pulses and the second plurality of pulses; and
  a second OR gate configured to perform the second OR operation on a result of the first OR operation by the first OR gate and the up signal.

11. An apparatus comprising:
  a phase locked loop including an OR gating circuit configured to perform a first OR operation on an up signal, a first plurality of pulses and a second plurality of pulses, and to perform a second OR operation on a down signal, the first plurality of pulses and the second plurality of pulses, the phase locked loop configured to,
  detect a phase difference between a reference signal and a feedback signal,
  generate a control current based on the detected phase difference and the first and second plurality of pulses, respective durations of the first and second plurality of pulses being non-linearly increased,
  generate a control voltage based on the control current, and
  generate an output signal based on the control voltage.

12. The apparatus of claim 11, further comprising:
a non-linear profile generator configured to,
  generate the first plurality of pulses, respective durations of the first plurality of pulses being increased by a first increment, and
  generate the second plurality of pulses, respective durations of the second plurality of pulses being increased by a second increment.

13. The apparatus of claim 12, wherein the phase locked loop comprises:
  a phase detector configured to detect the phase difference and to generate the up signal and the down signal based on the detected phase difference, wherein
  the OR gating circuit is configured to perform the first OR operation on the first plurality of pulses, the second plurality of pulses, and the up signal, and to perform the second OR operation on the first plurality of pulses, the second plurality of pulses, and the down signal;
  a charge pump configured to generate the control current based on results of the first OR operation and the second OR operation;
  a loop filter configured to output the control voltage based on the control current; and
  a voltage controlled oscillator configured to generate the output signal based on the control voltage.

14. The apparatus of claim 12, wherein a period of the first plurality of pulses and a period of the second plurality of pulses are identical to each other, and
  wherein the second plurality of pulses are generated later than the first plurality of pulses.

15. The apparatus of claim 11, wherein the feedback signal is based on dividing the output signal by a divisional ratio.

16. A non-linear spread spectrum clock generator comprising:
  a phase detector configured to:
    receive a reference signal and a feedback signal,
    detect a phase difference between the reference signal and the feedback signal, and
    generate an up signal and a down signal based on the phase difference;
  a non-linear profile generator configured to generate a plurality of step pulses, each of the plurality of step pulses having a non-linearly increasing pulse width, such that the plurality of step pulses approximate a signal having a non-linear profile waveform;
  an OR gating circuit configured to perform a first OR operation on the up signal, first step pulses of the plurality of step pulses and second step pulses of the plurality of step pulses, and to perform a second OR operation on the down signal, the first step pulses and the second step pulses;
  a charge pump configured to:
    receive a result of the OR gating circuit, and
    generate a control current based on the up signal, the down signal, and the plurality of step pulses;
  a loop filter configured to:
    receive the control current, and
    generate a control voltage based on the control current; and a voltage controlled oscillator configured to:
  receive the control voltage, and
  generate an output signal based on the control voltage.

17. The non-linear spread spectrum clock generator of claim 16, wherein
  the non-linear profile generator is a Hershey-Kiss profile generator configured to generate the plurality of step pulses, each of the plurality of step pulses having a non-linearly increasing pulse width, such that the plurality of step pulses approximate a signal having a Hershey-Kiss profile waveform; and
  the Hershey-Kiss profile generator is further configured to,
    generate the first step pulses of the plurality of step pulses, the first step pulses having pulse widths that increase according to a first increment, and
    generate the second step pulses of the plurality of step pulses, the second step pulses having pulse widths that increase according to a second increment, the second increment being greater than the first increment.

18. The non-linear spread spectrum clock generator of claim 17, wherein the Hershey-Kiss profile generator is configured to generate each of the second step pulses subsequently to generating a separate one of the first step pulses according to a lag time, the lag time being at least one cycle.

19. The non-linear spread spectrum clock generator of claim 17, wherein the Hershey-Kiss profile generator includes
  a first step pulse generator configured to generate the first step pulses; and
  a second step pulse generator configured to generate the second step pulses.

20. The non-linear spread spectrum clock generator of claim 19, wherein the OR gating circuit comprises:
  a first OR gate configured to
    receive the up signal, the first step pulses, and the second step pulses,
    execute the first OR operation with respect to the up signal, the first step pulses, and the second step pulses, and
    transmit the result of the first OR operation to the charge pump; and
  a second OR gate configured to
    receive the down signal, the first step pulses, and the second step pulses,
    execute the second OR operation with respect to the down signal, the first step pulses, and the second step pulses, and
    transmit the result of the second OR operation to the charge pump.

* * * * *